United States Patent
Zhang et al.

(10) Patent No.: US 12,477,749 B2
(45) Date of Patent: Nov. 18, 2025

(54) THREE-DIMENSIONAL MEMORY DEVICES HAVING SEMICONDUCTOR ASSEMBLIES BONDED BY BONDING LAYER AND METHODS FOR FORMING THE SAME

(71) Applicant: YANGTZE MEMORY TECHNOLOGIES CO., LTD., Wuhan (CN)

(72) Inventors: Kun Zhang, Wuhan (CN); Wenxi Zhou, Wuhan (CN); Wei Liu, Wuhan (CN); Zhiliang Xia, Wuhan (CN); Liang Chen, Wuhan (CN); Yanhong Wang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 571 days.

(21) Appl. No.: 17/483,204

(22) Filed: Sep. 23, 2021

(65) Prior Publication Data

US 2023/0005941 A1    Jan. 5, 2023

Related U.S. Application Data

(63) Continuation of application No. PCT/CN2021/103421, filed on Jun. 30, 2021.

(51) Int. Cl.
*H10B 80/00* (2023.01)
*H01L 25/16* (2023.01)
(Continued)

(52) U.S. Cl.
CPC ............. *H10B 80/00* (2023.02); *H01L 25/16* (2013.01); *H10B 41/10* (2023.02); *H10B 41/27* (2023.02);
(Continued)

(58) Field of Classification Search
CPC ........ H10B 41/40; H10B 41/10; H10B 41/27; H10B 41/35; H10B 43/10; H10B 43/27;
(Continued)

(56) References Cited

U.S. PATENT DOCUMENTS 10,283,493 B1 * 5/2019 Nishida ................. H10B 43/27
10,629,616 B1 4/2020 Kai et al.
(Continued)

FOREIGN PATENT DOCUMENTS

CN          111566815 A      8/2020

OTHER PUBLICATIONS

International Search Report issued in corresponding International Application No. PCT/CN2021/103421, mailed Mar. 29, 2022, 4 pages.

*Primary Examiner* — Eliseo Ramos Feliciano
*Assistant Examiner* — Brad A Knudson
(74) *Attorney, Agent, or Firm* — BAYES PLLC

(57) ABSTRACT

Three-dimensional (3D) memory devices and methods for forming the same are disclosed. In certain aspects, a 3D memory device includes a first semiconductor assembly, a second semiconductor assembly, and an inter-assembly bonding layer between the first semiconductor assembly and the second semiconductor assembly. The first semiconductor assembly includes a first array structure and a first periphery structure. The first array structure includes a first memory stack having a plurality of interleaved stack conductive layers and stack dielectric layers. The first periphery structure includes a plurality of first peripheral circuits electrically connected to the first memory stack. The second semiconductor assembly includes a second array structure and a second periphery structure. The second array structure includes a second memory stack having a plurality of interleaved stack conductive layers and stack dielectric (Continued)

layers. The second periphery structure includes a plurality of second peripheral circuits electrically connected to the second memory stack.

20 Claims, 16 Drawing Sheets

(51) Int. Cl.
*H10B 41/10* (2023.01)
*H10B 41/27* (2023.01)
*H10B 41/35* (2023.01)
*H10B 41/40* (2023.01)
*H10B 41/50* (2023.01)
*H10B 43/10* (2023.01)
*H10B 43/27* (2023.01)
*H10B 43/35* (2023.01)
*H10B 43/40* (2023.01)
*H10B 43/50* (2023.01)

(52) U.S. Cl.
CPC ............ *H10B 41/35* (2023.02); *H10B 41/40* (2023.02); *H10B 41/50* (2023.02); *H10B 43/10* (2023.02); *H10B 43/27* (2023.02); *H10B 43/35* (2023.02); *H10B 43/40* (2023.02); *H10B 43/50* (2023.02); *H01L 2224/08145* (2013.01); *H01L 2225/06541* (2013.01); *H01L 2225/06565* (2013.01)

(58) Field of Classification Search
CPC ........ H10B 43/35; H10B 43/40; H10B 43/50; H01L 25/18; H01L 2224/08145; H01L 2225/06541; H01L 2225/06565; H01L 24/80; H01L 25/16
See application file for complete search history.

(56) References Cited

U.S. PATENT DOCUMENTS

| | | | |
|---|---|---|---|
| 10,636,813 | B1 | 4/2020 | Xiao |
| 10,651,153 | B2* | 5/2020 | Fastow ............... H01L 25/0652 |
| 10,741,535 | B1 | 8/2020 | Nishikawa et al. |
| 2019/0043836 | A1* | 2/2019 | Fastow ............... H01L 27/0688 |
| 2020/0194446 | A1* | 6/2020 | Nishida ........... H01L 21/823487 |
| 2020/0194452 | A1 | 6/2020 | Xiao |
| 2020/0227397 | A1* | 7/2020 | Yada ..................... H10B 43/40 |
| 2020/0266182 | A1* | 8/2020 | Nishikawa .......... H01L 23/5383 |
| 2020/0279861 | A1* | 9/2020 | Uryu ..................... H10B 43/40 |
| 2020/0286905 | A1 | 9/2020 | Kai et al. |
| 2020/0350286 | A1 | 11/2020 | Cheng et al. |
| 2021/0134820 | A1 | 5/2021 | Huang et al. |
| 2021/0233923 | A1* | 7/2021 | Oh ........................ H10B 41/30 |
| 2022/0208787 | A1* | 6/2022 | Baek ..................... H10B 41/41 |
| 2022/0246213 | A1* | 8/2022 | Takekida ............... G11C 16/10 |

* cited by examiner

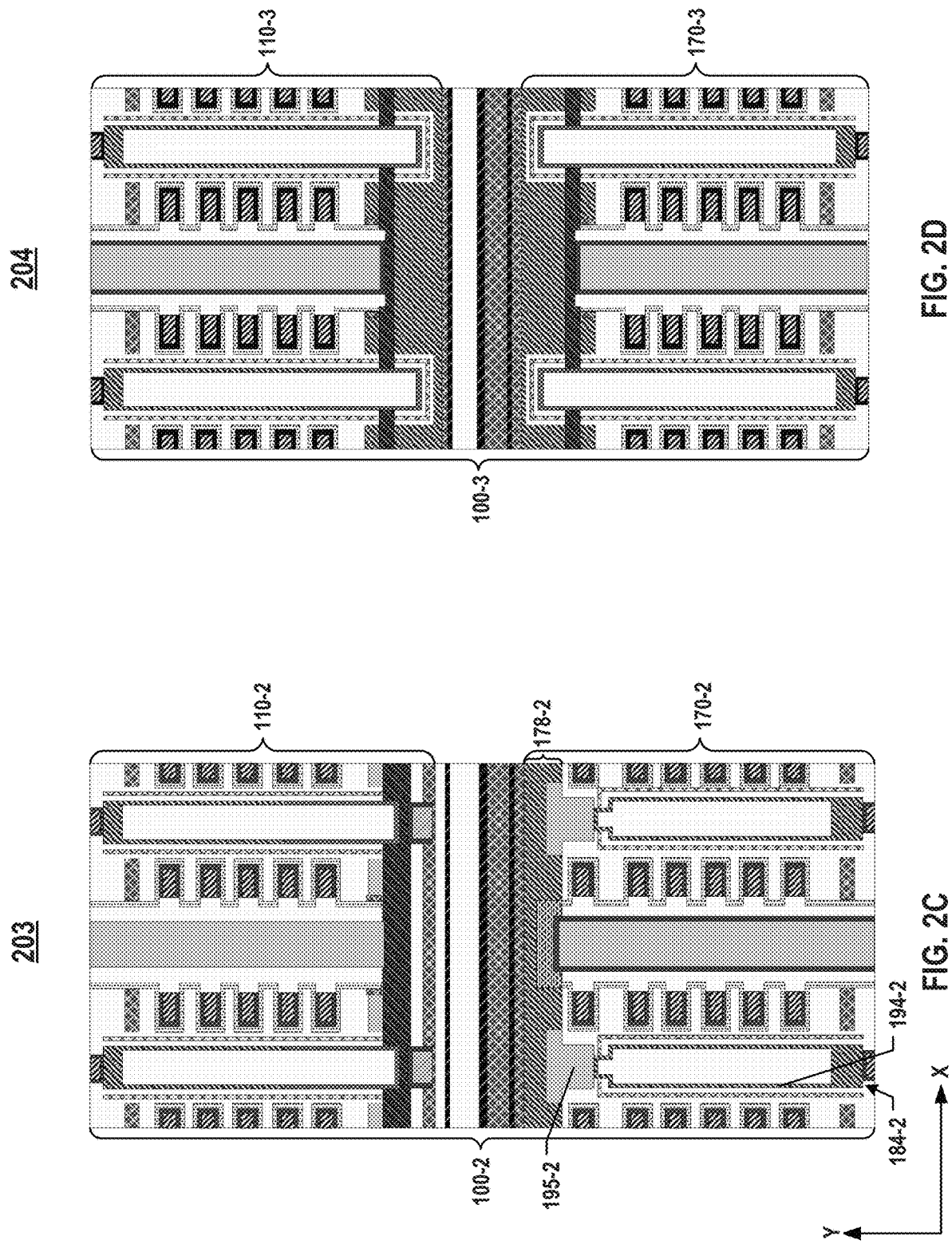

THREE-DIMENSIONAL MEMORY DEVICES HAVING SEMICONDUCTOR ASSEMBLIES BONDED BY BONDING LAYER AND METHODS FOR FORMING THE SAME

CROSS-REFERENCE TO RELATED APPLICATIONS

This application is continuation of International Application No. PCT/CN2021/103421, filed on Jun. 30, 2021, entitled "THREE-DIMENSIONAL MEMORY DEVICES AND METHODS FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY 3D memory devices and fabrication methods thereof are disclosed herein.

In one aspect, a 3D memory device includes a first semiconductor assembly, a second semiconductor assembly, and an inter-assembly bonding layer between the first semiconductor assembly and the second semiconductor assembly. The first semiconductor assembly includes a first array structure and a first periphery structure. The first array structure includes a first memory stack having a plurality of interleaved stack conductive layers and stack dielectric layers. The first periphery structure includes a plurality of first peripheral circuits electrically connected to the first memory stack. The second semiconductor assembly includes a second array structure and a second periphery structure. The second array structure includes a second memory stack having a plurality of interleaved stack conductive layers and stack dielectric layers. The second periphery structure includes a plurality of second peripheral circuits electrically connected to the second memory stack.

In another aspect, a method for forming a 3D memory device is provided. A first semiconductor substrate is provided, a first array structure is formed on the first semiconductor substrate, and a first periphery structure is formed adjacent to the first array structure, thus providing a first semiconductor assembly. The first array structure includes a first memory stack having a plurality of interleaved stack conductive layers and stack dielectric layers. The first periphery structure includes a plurality of first peripheral circuits electrically connected to the first memory stack. A second semiconductor substrate is provided, a second array structure is formed on the second semiconductor substrate, and a second periphery structure is formed adjacent to the second array structure, thus providing a second semiconductor assembly. The second array structure includes a second memory stack having a plurality of interleaved stack conductive layers and stack dielectric layers. The second periphery structure includes a plurality of second peripheral circuits electrically connected to the second memory stack. The first semiconductor assembly and the second semiconductor assembly are bonded through an inter-assembly bonding layer.

In still another aspect, a system includes a 3D memory device configured to store data and a memory controller control the 3D memory device. The 3D memory device includes a first semiconductor assembly, a second semiconductor assembly, and an inter-assembly bonding layer between the first semiconductor assembly and the second semiconductor assembly. The first semiconductor assembly includes a first array structure and a first periphery structure. The first array structure includes a first memory stack having a plurality of interleaved stack conductive layers and stack dielectric layers. The first periphery structure includes a plurality of first peripheral circuits electrically connected to the first memory stack. The second semiconductor assembly includes a second array structure and a second periphery structure. The second array structure includes a second memory stack having a plurality of interleaved stack conductive layers and stack dielectric layers. The second periphery structure includes a plurality of second peripheral circuits electrically connected to the second memory stack.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 2A-2F illustrate enlarged side views of a cross-section of the exemplary 3D memory device shown in FIG. 1A, according to some aspects of the present disclosure.

Figure 1A:
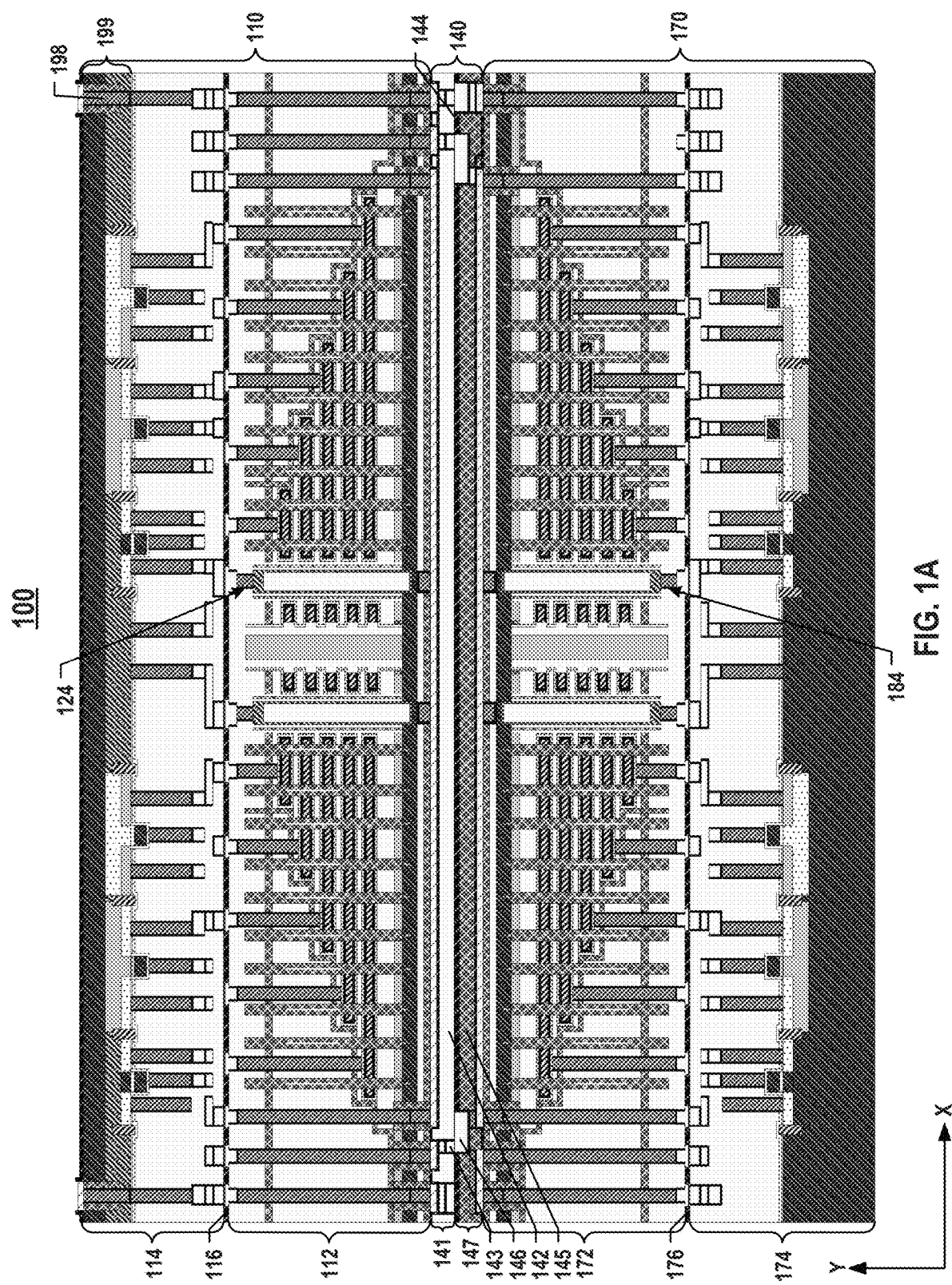
FIG. 1A illustrates a side view of a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 180 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent or entirety of an underlying or overlying structure. Further, a layer can be a region of a homogeneous or heterogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In some 3D NAND memory devices, to increase the storage capacity per unit area of such devices, semiconductor designers may choose one or more approaches, such as increasing the storage capacity of each memory cell, adding levels to a semiconductor structure of the device, creating multiple decks of semiconductor structures, increasing the number of cells by shrinking the size of each memory cell, etc. These approaches may be accompanied by a myriad of manufacturing difficulties. For example, when multiple decks of semiconductor structures are stacked to form a 3D memory device, it becomes exceedingly difficult to control the overlay of channel structures of those decks. Also, deep etching is required through the multiple decks in order to connect channel side walls formed in the upper and lower channels across the decks. However, the lack of precision in channel overlay would cause damage to the channel structures during etching, especially in the lower decks, and also cause under etching of the bottom layers of certain channel structures. Additionally, epitaxial growth of semiconductor materials at the bottom of the channel structures also becomes difficult.

To address one or more of the aforementioned issues, the present disclosure introduces a solution in which two semiconductor assemblies are bonded together, with an inter-assembly bonding layer formed between the two assemblies. In particular, each semiconductor assembly may include an array structure comprising a memory stack having a plurality of interleaved stack conductive layers and stack dielectric layers, and a periphery structure comprising a plurality of peripheral circuits electrically connected to the memory stack. Therefore, the cell density of the 3D memory devices is increased without sacrificing the cell size for each memory cell that would otherwise cause the abovementioned issues. As a result, the electric performance of the 3D memory devices can be improved.

Figure 1B:
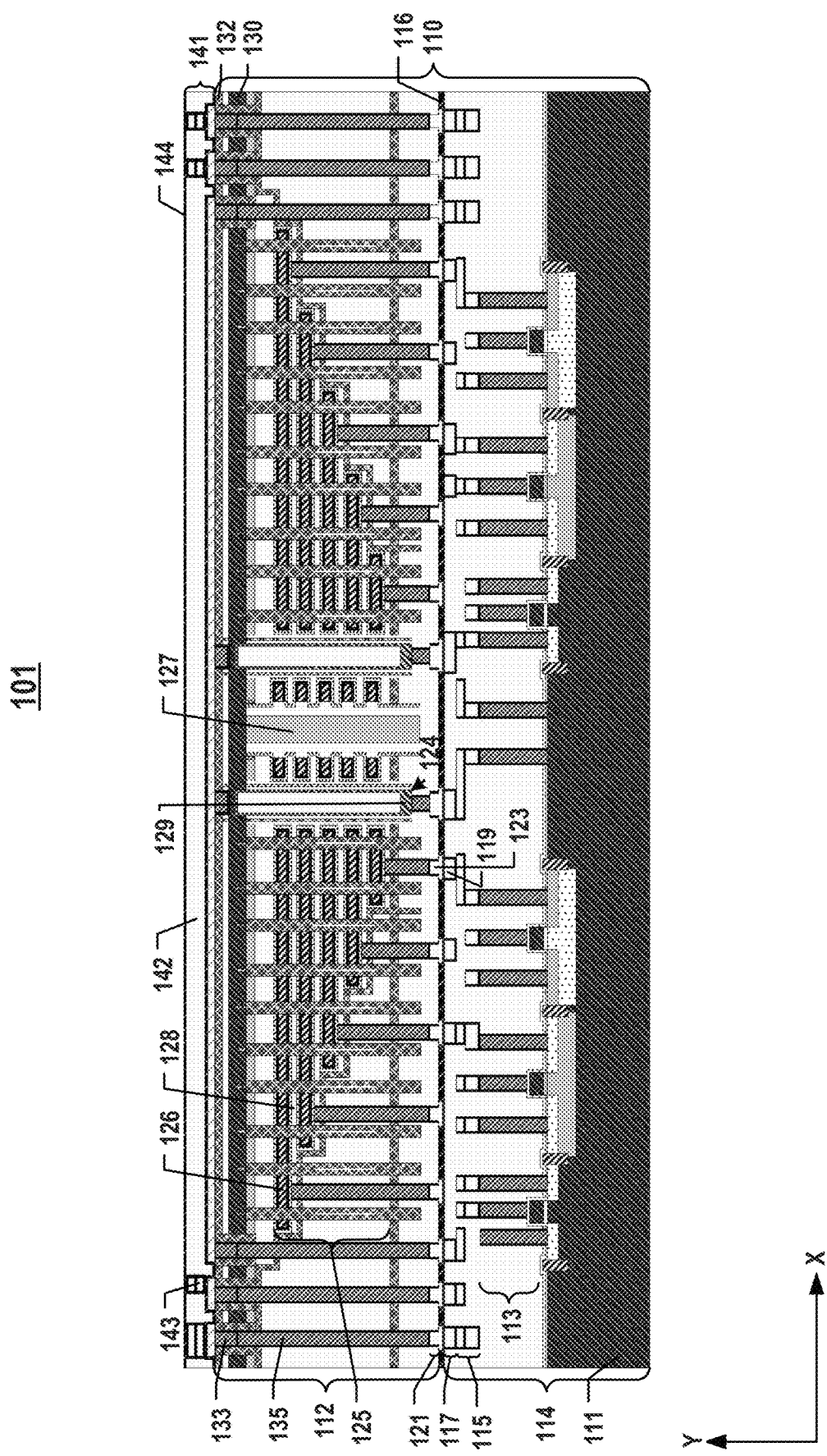
FIG. 1B illustrates a side view of a portion of the cross-section of 3D memory device shown in FIG. 1A, according to some aspects of the present disclosure.

FIG. 1A illustrates a side view of a cross-section of an exemplary 3D memory device 100, according to some aspects of the present disclosure. In some implementations, 3D memory device 100 is a single chip including a first semiconductor assembly 110, a second semiconductor assembly 170, and an inter-assembly bonding layer 140 between the two assemblies. Inter-assembly bonding layer 140 may include a first portion 141 adjacent to first semiconductor assembly 110, and a second portion 147 adjacent to second semiconductor assembly 170. FIG. 1B illustrates a side view of a portion 101 of the cross-section of 3D memory device shown in FIG. 1A, according to some aspects of the present disclosure. In particular, the side view shows first semiconductor assembly 110 and a first portion 141 of inter-assembly bonding layer 140. It is noted that x and y axes are included in FIGS. 1A and 1B to further illustrate the spatial relationship of the components in 3D memory device 100 having semiconductor assemblies 110 and 170. 3D memory device 100 includes two lateral surfaces (e.g., a top surface and a bottom surface) extending laterally in the x-direction (i.e., the lateral direction). As used herein, whether one component (e.g., a layer or an assembly) is on, above, or below another component (e.g., a layer or an assembly) of a semiconductor device (e.g., 3D memory device 100) is determined relative to the semiconductor assembly (e.g., semiconductor assembly 170) of the semiconductor device in the y-direction (i.e., the vertical direction) when the semiconductor assembly is positioned in the lowest plane of the semiconductor device in the y-direction. The same notion for describing spatial relationships is applied throughout the present disclosure, unless otherwise specified. It is further noted that first semiconductor assembly 110 and first portion 141 of inter-assembly bonding layer 140 are in a flipped position in FIG. 1B as opposed to in FIG. 1A.

In some implementations, first semiconductor assembly 110 includes a first array structure 112 and a first periphery structure 114. First periphery structure 114 can be formed separately from and bonded with first array structure 112. Alternatively, first periphery structure 114 can be formed after the formation of and adjacent to first array structure 112. A bonding interface 116 is disposed between first array structure 112 and first periphery structure 114, according to some implementations.

According to the present disclosure, first periphery structure 114 can include a substrate 111. Substrate 111 is not adjacent to, thus facing away from, inter-assembly bonding layer 140. Substrate 111 can include silicon (e.g., single crystalline silicon, c-Si), silicon germanium (SiGe), gallium arsenide (GaAs), germanium (Ge), silicon-on-insulator (SOI), or any other suitable materials. First periphery structure 114 can further include a plurality of peripheral circuits 113 on substrate 111, which are configured to control and sense first semiconductor assembly 110 and/or second semiconductor assembly 170. Peripheral circuits 113 can be any suitable digital, analog, and/or mixed-signal control and sensing circuits used to facilitate the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 113 can include transistors formed on substrate 111, in which the entirety or part of the transistors are formed in substrate 111 (e.g., below the top surface of substrate 111) and/or directly on substrate 111. Isolation regions (e.g., shallow trench isolations (STIs)) and doped regions (e.g., source regions and drain regions of the transistors) can be formed in substrate 111 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, peripheral circuits 113 may further include any other circuits compatible with the advanced logic processes including logic circuits, such as processors and programmable logic devices (PLDs), or memory circuits, such as static random-access memory (SRAM) and dynamic RAM (DRAM).

In some implementations, first semiconductor assembly 110 of 3D memory device 100 further includes an interconnect layer 115 above peripheral circuits 113 to transfer electrical signals to and from peripheral circuits 113. Interconnect layer 115 can include a plurality of interconnects (also referred to herein as contacts), including lateral interconnect lines and vertical interconnect access (VIA) contacts. As used herein, the term interconnects can broadly include any suitable types of interconnects, such as middle-end-of-line (MEOL) interconnects and back-end-of-line (BEOL) interconnects. Interconnect layer 115 can further include one or more interlayer dielectric (ILD) layers (a.k.a. intermetal dielectric (IMD) layers) in which the interconnect lines and VIA contacts can form. That is, interconnect layer 115 can include interconnect lines and VIA contacts in multiple ILD layers. The interconnect lines and VIA contacts in interconnect layer 115 can include conductive materials including, but not limited to, tungsten (W), cobalt (Co), copper (Cu), aluminum (Al), silicides, or any combination thereof. The ILD layers in interconnect layer 115 can include dielectric materials including, but not limited to, silicon oxide, silicon nitride, silicon oxynitride, low dielectric constant (low-k) dielectrics, or any combination thereof.

In some implementations, first periphery structure 114 of first semiconductor assembly 110 further includes a bonding layer 117 at bonding interface 116 and above interconnect layer 115 and peripheral circuits 113. Bonding layer 117 can include a plurality of interface contacts 119 and dielectrics electrically isolating interface contacts 119. Interface contacts 119 can include conductive materials including, but not limited to, W, Co, Cu, Al, silicides, or any combination thereof. The remaining area of bonding layer 117 can be formed with dielectrics including, but not limited to, silicon oxide, silicon nitride, silicon oxynitride, low-k dielectrics, or any combination thereof. Interface contacts 119 and surrounding dielectrics in bonding layer 117 can be used for hybrid bonding.

Similarly, as shown in FIG. 1B, first array structure 112 of first semiconductor assembly 110 can also include a bonding layer 121 at bonding interface 116 and above bonding layer 117 of first periphery structure 114. Bonding layer 121 can include a plurality of interface contacts 123 and dielectrics electrically isolating interface contacts 123. Interface contacts 123 can include conductive materials including, but not limited to, W, Co, Cu, Al, silicides, or any combination thereof. The remaining area of bonding layer 121 can be formed with dielectrics including, but not limited to, silicon oxide, silicon nitride, silicon oxynitride, low-k dielectrics, or any combination thereof. Interface contacts 123 and surrounding dielectrics in bonding layer 121 can be used for hybrid bonding. Interface contacts 123 are in contact with interface contacts 119 of bonding layer 117 at bonding interface 116, according to some implementations, thus enabling peripheral circuits 113 to be electrically connected to memory stack 125, which is to be discussed in detail hereinafter.

In some implementations, first array structure 112 can be bonded on top of first periphery structure 114 in a face-to-face manner at bonding interface 116. In other implementations, bonding interface 116 is disposed between bonding layers 117 and 121 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 116 is the place at which bonding layers 117 and 121 are met and bonded. In practice, bonding interface 116 can be a layer with a certain thickness that includes the top surface of bonding layer 117 of first periphery structure 114 and the bottom surface of bonding layer 121 of first array structure 112.

In some implementations, first array structure 112 further includes an interconnect layer (not shown) above bonding layer 121 to transfer electrical signals. Similar to interconnect layer 115 of first periphery structure 114, the interconnect layer of first array structure 112 can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some implementations, 3D memory device 100 is a NAND Flash memory device in which memory cells are provided in the form of an array of NAND memory strings. Each NAND memory string can include a respective channel structure 124. As shown in FIG. 1B, each channel structure 124 can extend vertically through a plurality of pairs each including a stack conductive layer 126 and a stack dielectric layer 128. The interleaved stack conductive layers 126 and stack dielectric layers 128 are part of memory stack 125. The number of the pairs of stack conductive layers 126 and stack dielectric layers 128 in memory stack 125 determines the number of memory cells in first semiconductor assembly 110. It is understood that in some implementations, memory stack 125 may have a multi-deck architecture, such as that in 3D memory device 100 having a first semiconductor assembly 110 and a second semiconductor assembly 170, as shown in FIG. 1A, which includes a plurality of memory decks stacked over one another. The numbers of the pairs of stack conductive layers 126 and stack dielectric layers 128 in each memory deck can be the same or different.

Memory stack 125 can include a plurality of interleaved stack conductive layers 126 and stack dielectric layers 128. Stack conductive layers 126 and stack dielectric layers 128 in memory stack 125 can alternate in the vertical direction. In other words, except the ones at the top or bottom of memory stack 125, each stack conductive layer 126 can be adjoined by two stack dielectric layers 128 on both sides, and each stack dielectric layer 128 can be adjoined by two stack conductive layers 126 on both sides. Stack conductive layers 126 can include conductive materials including, but not limited to, W, Co, Cu, Al, polysilicon, doped silicon, silicides, or any combination thereof. Each stack conductive layer 126 can include a gate electrode (gate line) surrounded by an adhesive layer and a gate dielectric layer. The gate electrode of stack conductive layer 126 can extend laterally as a word line, ending at one or more staircase structures of memory stack 125. Stack dielectric layers 128 can include dielectric materials including, but not limited to, silicon oxide, silicon nitride, silicon oxynitride, or any combination thereof.

As shown in FIG. 1B, first array structure 112 of first semiconductor assembly 110 can also include a doped semiconductor layer 130 above memory stack 125. Doped semiconductor layer 130 can include doped polysilicon and work as the sidewall selective epitaxial growth (SEG) surrounding channel structures 124 and/or as the conductive layer electrically connecting channel structures 124. Thus, doped semiconductor layer 130 is in contact with channel structures 124.

In some implementations, each channel structure 124 includes a channel hole filled with a semiconductor layer (e.g., as a semiconductor channel) and a composite dielectric layer (e.g., as a memory film). In some implementations, the semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. The remaining space of the channel hole can be partially or fully filled with a capping layer including dielectric materials, such as silicon oxide, and/or an air gap. Channel structure 124 can have a cylinder shape (e.g., a pillar shape). The capping layer, the semiconductor channel, the tunneling layer, storage layer, and blocking layer of the memory film are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the memory film can include a composite layer of silicon oxide/silicon oxynitride/silicon oxide (ONO). In some implementations, channel structure 124 further includes a channel plug 129 in the bottom portion (e.g., at the lower end) of channel structure 124. Doped semiconductor layer 130 can be in contact with the semiconductor channel. In addition, channel plug 129 can be in contact with the semiconductor channel. Channel plug 129 can include semiconductor materials (e.g., polysilicon). In some implementations, channel plug 129 functions as the drain of channel structure 124.

As shown in FIG. 1B, each channel structure 124 can extend vertically through interleaved stack conductive layers 126 and stack dielectric layers 128 of memory stack 125 into doped semiconductor layer 130. In some implementations, the semiconductor channel can include a doped portion and an undoped portion. It is understood that one or more of stack conductive layers 126 that are close to doped semiconductor layer 130 may each be a source select gate (SSG, sometimes referred to as bottom select gate (BSG)), and the rest of stack conductive layers 126 may include word lines. In some implementations, the one or more source select gates laterally face the doped portion. It is understood that if first array structure 112 includes more than one source select gate, the doped portion may extend beyond all source select gates. On the other hand, the doped portion may not extend further to face word lines. That is, the lower end of the doped portion is between source select gates and word lines in the vertical direction, according to some implementations.

In some implementations, the doped portion of the semiconductor channel includes N-type doped polysilicon. The dopant can be any suitable N-type dopants, such as phosphorus (P), arsenic (Ar), or antimony (Sb), which contribute free electrons and increase the conductivity of the intrinsic semiconductor. In some implementations, the doping concentration of doped portion is between about $10^{19}$ cm$^{-3}$ and about $10^{21}$ cm$^{-3}$, such as between $10^{19}$ cm$^{-3}$ and $10^{21}$ cm$^{-3}$ (e.g., $10^{19}$ cm$^{-3}$, $2\times10^{19}$ cm$^{-3}$, $3\times10^{19}$ cm$^{-3}$, $4\times10^{19}$ cm$^{-3}$, $5\times10^{19}$ cm$^{-3}$, $6\times10^{19}$ cm$^{-3}$, $7\times10^{19}$ cm$^{-3}$, $8\times10^{19}$ cm$^{-3}$, $9\times10^{19}$ cm$^{-3}$, $10^{20}$ cm$^{-3}$, $2\times10^{20}$ cm$^{-3}$, $3\times10^{20}$ cm$^{-3}$, $4\times10^{20}$ cm$^{-3}$, $5\times10^{20}$ cm$^{-3}$, $6\times10^{20}$ cm$^{-3}$, $7\times10^{20}$ cm$^{-3}$, $8\times10^{20}$ cm$^{-3}$, $9\times10^{20}$ cm$^{-3}$, $10^{21}$ cm$^{-3}$, any range bounded by the lower end by any of these values, or in any range defined by any two of these values).

As shown in FIG. 1B, first array structure 112 of first semiconductor assembly 110 can further include one or more insulating structures 127 each extending vertically through interleaved stack conductive layers 126 and stack dielectric layers 128 of memory stack 125. Different from channel structure 124 that extends further into doped semiconductor layer 130, insulating structures 127 stops at the bottom surface of doped semiconductor layer 130, i.e., does not extend vertically into doped semiconductor layer 130, according to some implementations. That is, the top surface of insulating structure 127 can be flush with or lower than the bottom surface of doped semiconductor layer 130. Each insulating structure 127 can also extend laterally to separate channel structures 124 into a plurality of blocks. That is, memory stack 125 can be divided into a plurality of memory blocks by insulating structures 127, such that the array of channel structures 124 can be separated into each memory block. Different from the slit structures in existing 3D NAND memory devices, which include front side array common source (ACS) contacts, insulating structures 127 do not include any contact therein (i.e., not functioning as the source contact) and thus, do not introduce parasitic capacitance and leakage current with stack conductive layers 126, according to some implementations. In some implementations, each insulating structure 127 includes an opening (e.g., a slit) filled with one or more dielectric materials, including, but not limited to, silicon oxide, silicon nitride, silicon oxynitride, or any combination thereof. In one example, each insulating structure 127 may be filled with silicon oxide. It is understood that in some examples, insulating structure 127 may be partially filled with non-dielectric materials, such as polysilicon, to adjust the mechanical properties, e.g., the hardness and/or stress, of insulating structure 127.

The top surface of first semiconductor assembly 110 can include a stop layer 132. Stop layer 132 can include any suitable materials that have a high etching selectivity (e.g., greater than about 5), such as silicon oxide, silicon nitride, or polysilicon. As shown in FIG. 1B, stop layer 132 may have one or more contacts 133 passing through stop layer 132 and doped semiconductor layer 130. In some implementations, contacts 133 are through-silicon via (TSV) type of contacts. Contacts 133 each can include one or more conductive layers, such as a metal layer (e.g., W, Co, Cu, or Al) or a silicide layer surrounded by an adhesive layer (e.g., TiN). In some implementations, at least one contact 133 further includes a spacer (e.g., a dielectric layer) to electrically separate contact 133 from doped semiconductor layer 130.

In some implementations, first array structure 112 of first semiconductor assembly 110 further includes peripheral contacts 135 each extending vertically outside of memory stack 125. Each peripheral contact 135 can have a depth greater than the depth of memory stack 125 to extend vertically from interface contact 123 to doped semiconductor layer 130 in a peripheral region that is outside of memory stack 125. In some implementations, peripheral contact 135 is below and in contact with contact 133, such that a doped semiconductor layer in first array structure 112 is electrically connected to peripheral circuits 113 in first periphery structure 114. Peripheral contacts 135 each can include one or more conductive layers, such as a metal layer (e.g., W, Co, Cu, or Al) or a silicide layer surrounded by an adhesive layer (e.g., TiN).

The above descriptions use first semiconductor assembly 110 as an example. It is well understood that second semiconductor assembly 170 may have the same or almost identical components and configurations as first semiconductor assembly 110. For example, second semiconductor assembly 170 may similarly include a second array structure 172 and a second periphery structure 174. Second periphery structure 174 can be formed separately from and bonded with second array structure 172. In some implementations, secondary periphery structure 174 and second array structure 172 are formed simultaneously, therefore saving fabrication time. Alternatively, second periphery structure 174 can be formed after the formation of and adjacent to second array structure 172. A bonding interface 176 is disposed between second array structure 172 and second periphery structure 174, as shown in FIG. 1A.

In some implementations, second array structure 172 includes a second memory stack having a plurality of interleaved stack conductive layers and stack dielectric layers. The relative positions of these stack conductive layers and stack dielectric layers may be the same as those of first array structure 112 described above. In some implementations, second periphery structure 174 includes a plurality of peripheral circuits electrically connected to the second memory stack of second array structure 172.

According to the present disclosure, inter-assembly bonding layer 140 is provided between first semiconductor assembly 110 and second semiconductor assembly 170, according to some implementations. First semiconductor assembly 110 and second semiconductor assembly 170 may both contain the same components that are symmetric about inter-assembly bonding layer 140 once 3D memory device 100 is formed. The symmetric relationship between the same or almost identical components makes it easier to align the two assemblies during the bonding process. In some implementations, second semiconductor assembly 170 includes a channel structure 184 extending through the second memory stack. Channel structure 184 may be symmetric with channel structure 124 about inter-assembly bonding layer 140. It is understood that, in some implementations, channel structure 184 and channel structure 124 do not necessarily have to be symmetric, such as those in 3D memory devices 100-1, 100-2, and 100-4 shown in FIGS. 2B, 2C, and 2E.

As shown in FIG. 1A, the array structure of each semiconductor assembly is vertically more adjacent to inter-assembly bonding layer 140 than its corresponding periphery structure in the same semiconductor assembly. For example, first array structure 112 is closer to inter-assembly bonding layer 140 than first periphery structure 114; second array structure 172 is closer to inter-assembly bonding layer 140 than second periphery structure 174. This configuration streamlines the pad-out manufacturing process, in which electrical contacts with the peripheral circuits are provided on a side of 3D memory device 100.

In some other implementations not shown herein, the periphery structure of each semiconductor assembly is vertically more adjacent to the inter-assembly bonding layer than its corresponding array structure in the same semiconductor assembly. For example, the first periphery structure is closer to the inter-assembly bonding layer than the first array structure; the second periphery structure is closer to the inter-assembly bonding layer than the second array structure. Each semiconductor assembly in this configuration can be formed by a transfer bonding method, in which the periphery structure can be formed in a second doped semiconductor layer formed over the array structure having a first doped semiconductor layer, and a contact pad in electrical contact with the periphery structure can be formed over the periphery structure. Thus, the two semiconductor assemblies can be subsequently bonded via the inter-assembly bonding layer from the side of each semiconductor assembly having the contact pad. This configuration may have additional benefits of reducing thermal damage to the periphery structure and allows the electrical path to be formed entirely by copper.

According to the present disclosure, inter-assembly bonding layer 140 can include a conductive material and a dielectric material, so that first semiconductor assembly 110 and second semiconductor assembly 170, after being bonded, are electrically connected at desired locations while electrically isolated at the rest of the locations of inter-assembly bonding layer 140. In some implementations, inter-assembly bonding layer 140 includes at least one bonding contact 143, as shown in FIG. 1A.

Bonding contact 143 can be partially or entirely embedded within a bonding layer 142. In implementations where bonding contact 143 is entirely embedded within bonding layer 142, as shown in FIG. 1B, the surface of bonding contact 143 may be flush with the surface of bonding layer 142 in order to reduce stress or even breakup of the semiconductor assembly formed thereon, which is caused by unevenness of the surface of inter-assembly bonding layer 140. Bonding contact 143 can include a conductive material including, but not limited to, W, Co, Cu, Al, silicides, or any combination thereof. Thus, after the two semiconductor assemblies are bonded together with conductive components aligned, at least one of first peripheral circuits 113 of first semiconductor assembly 110 may be, via bonding contact 143, electrically connected to at least one of second peripheral circuits of second semiconductor assembly 170. In contrast, to achieve electrical isolation between two semiconductor assemblies bonded through inter-assembly bonding layer 140, bonding layer 142 can be formed with dielectrics including, but not limited to, silicon oxide, silicon nitride, silicon oxynitride, low-k dielectrics, or any combination thereof.

In some implementations, bonding contact 143 is formed at locations of inter-assembly bonding layer 140 under which no memory stacks 125, channel structures 124, or insulating structures 127 are vertically located, as shown in FIG. 1B. Thus, according to the present disclosure, bonding contact 143 may be provided in inter-assembly bonding layer 140 at a location laterally away from both the memory stacks of both semiconductor assemblies 110, 170. This configuration has the advantage that bonding contact 143 is directly positioned between the first and second peripheral circuits of both semiconductor assemblies 110, 170, thereby getting rid of unnecessary wiring and shortening the signal transmission time.

In some implementations, inter-assembly bonding layer 140 includes a first portion 141 and a second portion 147, as shown in FIG. 1A. First portion 141 can be formed along with or after the formation of first semiconductor assembly 110. Similarly, second portion 147 can be formed along with or after the formation of second semiconductor assembly 170. As shown in FIG. 1B, first portion 141 can be positioned above first semiconductor assembly 110. As shown in FIG. 1A, second portion 147 can be positioned above second semiconductor assembly 170. In some implementations, second portion 147 also includes a bonding contact 146 and a layer 145. Bonding contact 146 can include conductive materials including, but not limited to, W, Co, Cu, Al, silicides, or any combination thereof. Bonding layer 145 can be formed with dielectrics including, but not limited to, silicon oxide, silicon nitride, silicon oxynitride, low-k dielectrics, or any combination thereof. Bonding contact 146 can be partially or entirely embedded within a bonding layer 145. In implementations where bonding contact 146 is entirely embedded within bonding layer 145, the surface of bonding contact 146 may be flush with the surface of bonding layer 145.

When inter-assembly bonding layer 140 includes two portions 141, and 147, they may be joined at a bonding interface 144 by various bonding technologies. One example of such bonding technologies is hybrid bonding. In practice, bonding interface 144 can be a layer with a certain thickness that includes the bottom surface of bonding layer 141 of first semiconductor assembly 110 and the top surface of bonding layer 147 of second semiconductor assembly 170, as shown in FIG. 1A. In some other implementations, two semiconductor assemblies 110 and 170 may be bonded at bonding interface 144 through one of the other bonding technologies, such as anodic boding, fusion (direct) bonding, adhesive bonding, etc.

Through the bonding process, bonding contact 143 in first portion 141 and bonding contact 146 in second portion 147 are in contact with each other in a face-to-face manner at bonding interface 144, thus jointly serving as an electrical connection between peripheral contacts of both semiconductor assemblies 110, 170. The combined bonding contact 143 and bonding contact 146 may be collectively referred to as a bonding contact of inter-assembly bonding layer 140. As a result of this electrical connection, the electrical signals, such as data signals, control signals, etc., from either one of semiconductor assemblies 110, 170 may pass to the other. 3D memory device 100 may thus be operated (e.g., written, read, controlled, etc.) through a pad-out contact layer on one side of the device. As shown in FIG. 1A, a pad-out contact layer 199 may be provided on a side of first semiconductor assembly 110 to transfer electrical signals between 3D memory device 100 and an external circuit. In some implementations, pad-out contact layer 199 is a BEOL type of interconnect layer including one or more interconnects 198. As shown in FIG. 1A, pad-out contact layer 199 is not adjacent to, thus facing away from, inter-assembly bonding layer 140. Interconnects 198 formed on the surface of first semiconductor assembly 110 can thus be electrically connected to the peripheral circuits in second periphery structure 174 of second semiconductor assembly 170 through various conductive components, including interface contacts at bonding interface 174, peripheral contacts in second array structure 172, bonding contacts 143, 147 at inter-assembly bonding layer 140, peripheral contacts 135 in first array structure 112 of first semiconductor assembly 110, interface contacts 119, 123 at bonding interface 116, and peripheral circuits 113 in first periphery structure 114. As a result, electrical signals can be communicated between an external circuit and various components of 3D memory device 100, including first periphery structure 114, first array structure 112, second array structure 172, and second periphery structure 174.

The present disclosure allows 3D memory device 100 to significantly increase storing capacity per unit area on a lateral surface, thanks to the more memory cells lined up vertically in the device, which at least double the number of memory cells in the conventional 3D memory devices without using the technology disclosed herein. It also saves manufacturing time because each semiconductor assembly can be parallelly manufactured, with roughly the same process, and then can be easily bonded together in the final operations of fabrication. Additionally, one semiconductor assembly can function as a support substrate to the other semiconductor assembly bonded therewith, because it has acquired sufficient thickness and robustness upon completion of fabrication. These numerous benefits render the present disclosure an ideal option for improving cell density of the 3D memory devices without sacrificing the cell size for each memory cell.

Figure 2B:
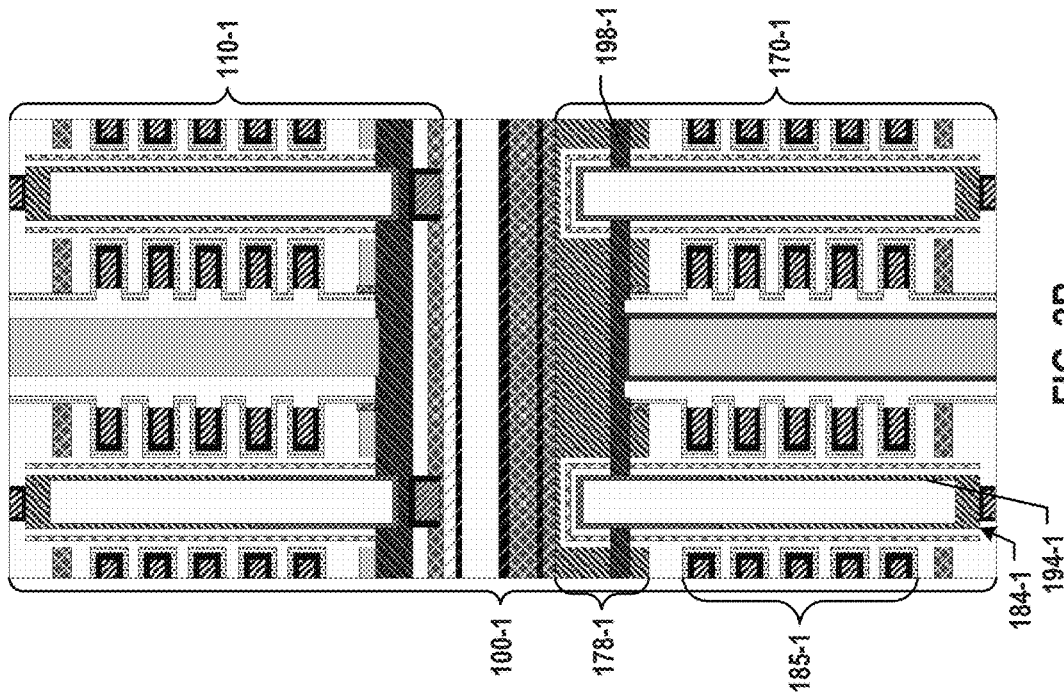
Figure 2A:
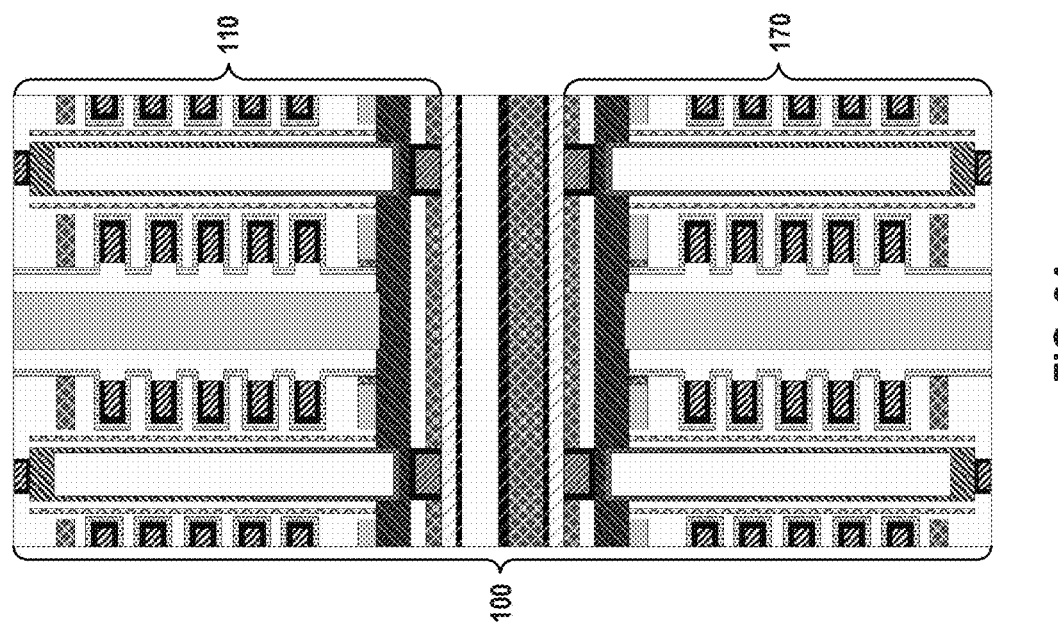

FIG. 2A illustrates an enlarged side view 201 of a cross-section of the exemplary 3D memory device 100 shown in FIG. 1A, according to some aspects of the present disclosure. As can be seen in FIG. 2A, the respective channel structures of semiconductor assemblies 110, 170 are the same, which have already been described in detail above and thus will not be repeated herein.

FIG. 2B illustrates an enlarged side view 202 of a cross-section of another exemplary 3D memory device 100-1, according to some aspects of the present disclosure. 3D memory device 100-1 also includes a first semiconductor assembly 110-1 and a second semiconductor assembly 170-1. First semiconductor assembly 110-1 may have the same components and configuration as first semiconductor assembly 110 of 3D memory device 100. Second semiconductor assembly 170-1 of 3D memory device 100-1 may include a channel structure 184-1 different from its counterpart in second semiconductor assembly 170 of 3D memory device 100, as shown in FIG. 2B.

In some implementations, channel structure 184-1 extends vertically through a memory stack 185-1 and a semiconductor layer 178-1. That is, channel structure 184-1 can include two portions: the upper portion surrounded by semiconductor layer 178-1 (i.e., above the interface between semiconductor layer 178-1 and memory stack 185-1) and the lower portion surrounded by memory stack 185-1 (i.e., below the interface between semiconductor layer 178-1 and memory stack 185-1). Similar to channel structure 124, channel structure 184-1 can also include a channel hole filled with a semiconductor layer (e.g., as a semiconductor channel 194-1) and a composite dielectric layer (e.g., as a memory film (not shown)). The memory film can further include a tunneling layer, a storage layer (also known as a "charge trap layer"), and a blocking layer. The remaining space of the channel hole can be partially or fully filled with a capping layer including dielectric materials, such as silicon oxide, and/or an air gap. Channel structure 174-1 can have a cylinder shape (e.g., a pillar shape). The capping layer, semiconductor channel 194-1, the tunneling layer, storage layer, and blocking layer of the memory film are arranged radially from the center toward the outer surface of the pillar in this order, according to some implementations.

As shown in FIG. 2B, part of semiconductor channel 194-1 along the sidewall of channel structure 184-1 (e.g., in the upper portion of channel structure 184-1) is in contact with a sublayer 198-1 of semiconductor layer 178-1, according to some embodiments. That is, the memory film is disconnected in the upper portion of channel structure 184-1 that abuts sublayer 198-1 of semiconductor layer 178-1, exposing semiconductor channel 194-1 to be in contact with the surrounding sublayer 198-1 of semiconductor layer 178-1, according to some embodiments. As shown in FIG. 2B, in some implementations, sublayer 198-1 is a polysilicon layer doped with any suitable N-type dopants, such as P, Ar, Sb. Sublayer 198-1 can be formed by replacing a sacrificial layer through a slit opened from the gate line. In other implementations not shown herein, sublayer 198-1 is a polysilicon layer doped with any suitable P-type dopants, such as boron (B), gallium (Ga), and aluminum (Al). Sublayer 198-1 can also be formed by replacing a sacrificial layer through a slit opened from the gate line, and a semiconductor plug may be formed by SEG process from semiconductor channel 194-1, thus creating a "sidewall SEG" of channel structure 184-1. This configuration can mitigate issues such as overlay control, epitaxial layer formation, and SONO punch.

FIG. 2C illustrates an enlarged side view 203 of a cross-section of another exemplary 3D memory device 100-2, according to some aspects of the present disclosure. 3D memory device 100-2 also includes a first semiconductor assembly 110-2 and a second semiconductor assembly 170-2. First semiconductor assembly 110-2 may have the same components and configuration as first semiconductor assembly 110 of 3D memory device 100. Second semiconductor assembly 170-2 of 3D memory device 100-2 may include a channel structure 184-2 different from its counterpart in second semiconductor assembly 170 of 3D memory device 100 or that in second semiconductor assembly 170-1 of 3D memory device 100-1.

As shown in FIG. 2C, a semiconductor plug 195-2 may be provided in an upper portion of the channel structure 184-2 that is in contact with semiconductor channel 194-2 and functions as a channel controlled by a source select gate of a memory stack of second semiconductor assembly 170-2. Semiconductor plug 195-2 can be partially embedded in a layer 178-2. In some implementations, semiconductor plug 195-2 and layer 178-2 use the same single crystalline silicon material so it can be formed by SEG process from layer 178-2. Therefore, semiconductor plug 195-2 can be in contact with semiconductor channel 194-2. In some implementations, semiconductor plug 195-2 can be electrically connected to an upper portion of semiconductor channel 194-2.

FIG. 2D illustrates an enlarged side view 204 of a cross-section of another exemplary 3D memory device 100-3, according to some aspects of the present disclosure. 3D memory device 100-3 also includes a first semiconductor assembly 110-3 and a second semiconductor assembly 170-3. Both first semiconductor assembly 110-3 and second semiconductor assembly 170-3 may have the same components and configuration as second semiconductor assembly 170-1 of 3D memory device 100-1. Thus, a detailed description thereof will not be repeated herein.

Figure 2F:
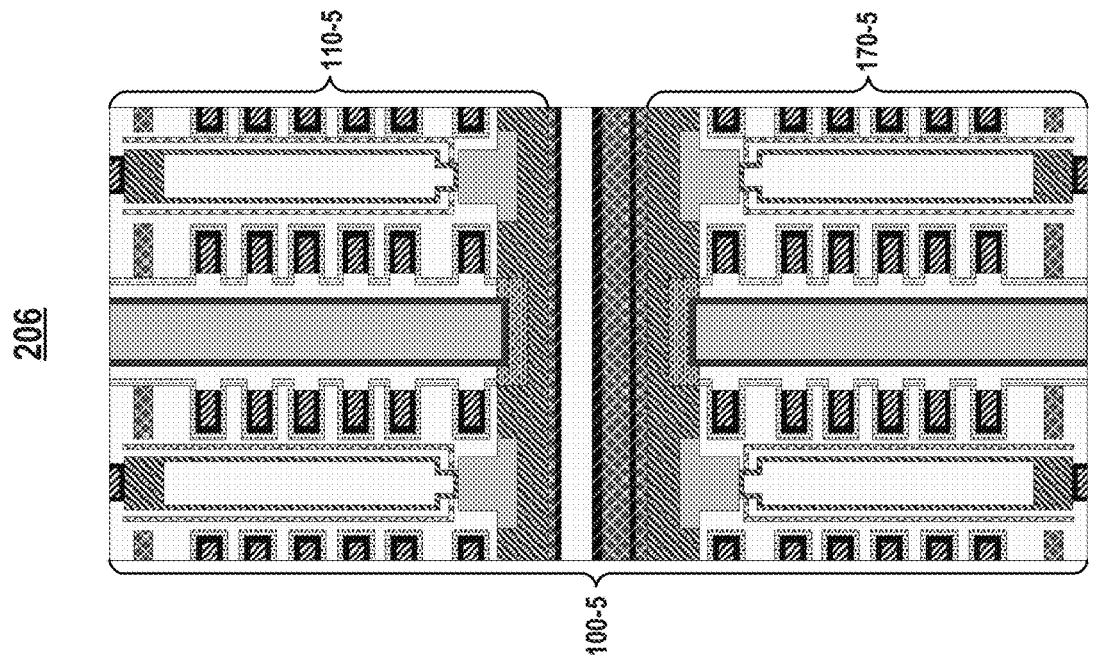
Figure 2E:
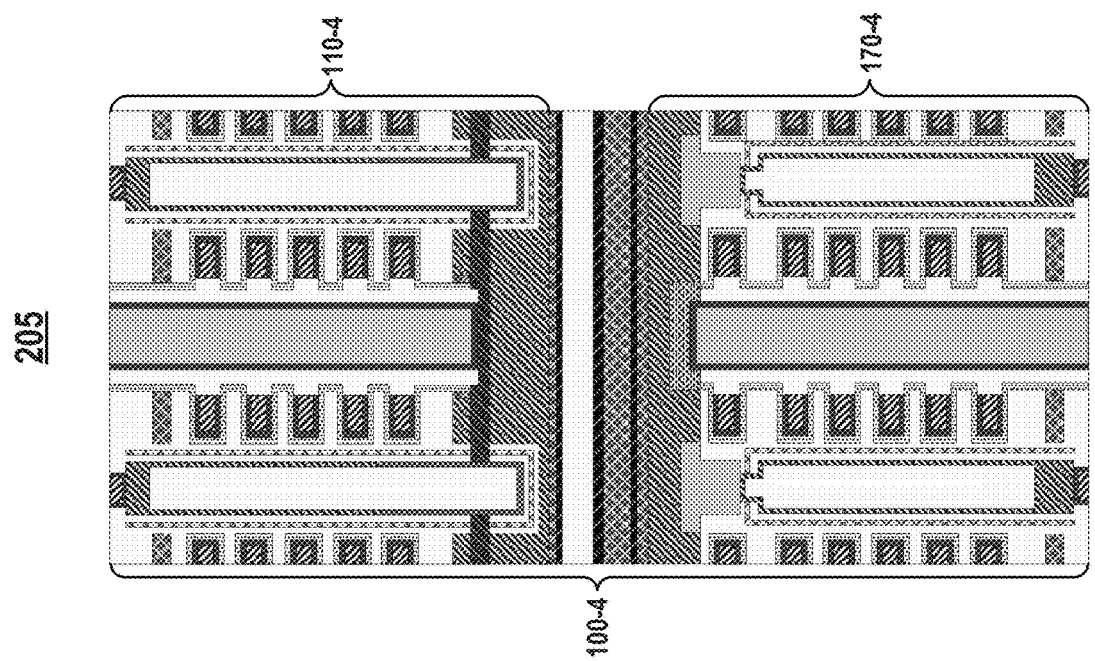

FIG. 2E illustrates an enlarged side view 205 of a cross-section of another exemplary 3D memory device 100-4, according to some aspects of the present disclosure. 3D memory device 100-4 also includes a first semiconductor assembly 110-4 and a second semiconductor assembly 170-4. First semiconductor assembly 110-4 may have the same components and configuration as second semiconductor assembly 170-1 of 3D memory device 100-1. Second semiconductor assembly 170-4 may have the same components and configuration as second semiconductor assembly 170-2 of 3D memory device 100-2. Thus, a detailed description thereof will not be repeated herein.

FIG. 2F illustrates an enlarged side view 206 of a cross-section of another exemplary 3D memory device 100-5, according to some aspects of the present disclosure. 3D memory device 100-5 also includes a first semiconductor assembly 110-5 and a second semiconductor assembly 170-5. Both first semiconductor assembly 110-5 and second semiconductor assembly 170-5 may have the same components and configuration as second semiconductor assembly 170-2 of 3D memory device 100-2. Thus, a detailed description thereof will not be repeated herein.

Figure 5:
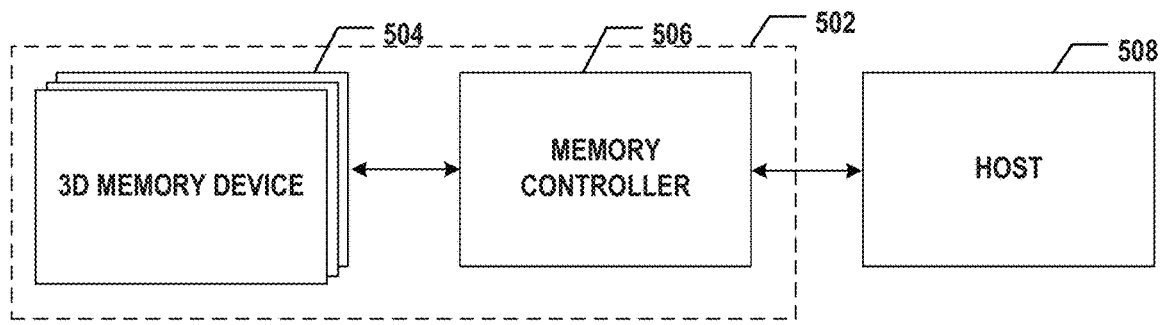
FIG. 5 illustrates a block diagram of an exemplary system having a 3D memory device, according to some aspects of the present disclosure.

FIG. 5 illustrates a block diagram of an exemplary system 500 having a 3D memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 5, system 500 can include a host 508 and a memory system 502 having one or more 3D memory devices 504 and a memory controller 506. Host 508 can be a processor of an electronic device, such as a central processing unit (CPU), or a system-on-chip (SoC), such as an application processor (AP). Host 508 can be configured to send or receive data stored in memory device 504.

3D memory device 504 can be any 3D memory devices disclosed herein, such as 3D memory device 100 shown in FIG. 1A. In some implementations, each 3D memory device 504 includes a NAND Flash memory. Consistent with the scope of the present disclosure, 3D memory device 504 can be fabricated by providing a first semiconductor assembly and a second semiconductor assembly, and bonding these two assemblies through an inter-assembly bonding layer. The inter-assembly bonding layer can include a first portion adjacent to the first semiconductor assembly and a second portion adjacent to the second semiconductor assembly, with each portion having a bonding contact embedded within a bonding layer of that portion. As a result, an electrical connection between the two semiconductor assemblies is set up. Therefore, storing capacity per unit area of 3D memory device 504 can be significantly increased on a lateral surface. As a result, the electric performance of 3D memory device 504 can be improved, which in turn improves the performance of memory system 502 and system 500, e.g., achieving higher operation speed.

Memory controller 506 is coupled to 3D memory device 504 and host 508 and is configured to control 3D memory device 504, according to some implementations. Memory controller 506 can manage the data stored in 3D memory device 504 and communicate with host 508. In some implementations, memory controller 506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 506 can be configured to control operations of 3D memory device 504, such as read, erase, and program operations. Memory controller 506 can also be configured to manage various functions with respect to the data stored or to be stored in 3D memory device 504 including, but not limited to bad-block management, garbage collection, logical-to-physical address conversion, wear leveling, etc. In some implementations, memory controller 506 is further configured to process error correction codes (ECCs) with respect to the data read from or written to 3D memory device 504. Any other suitable functions may be performed by memory controller 506 as well, for example, formatting 3D memory device 504. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 6A:
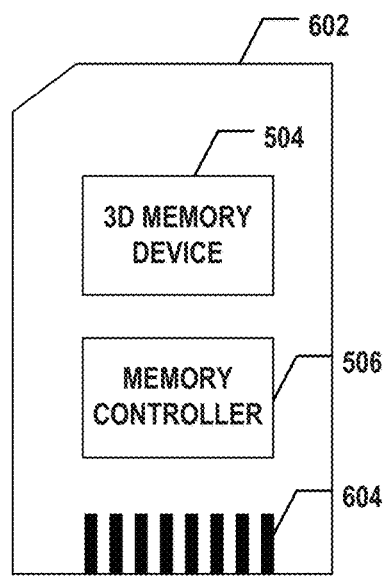
FIG. 6A illustrates a diagram of an exemplary memory card having a 3D memory device, according to some aspects of the present disclosure.
Figure 6B:
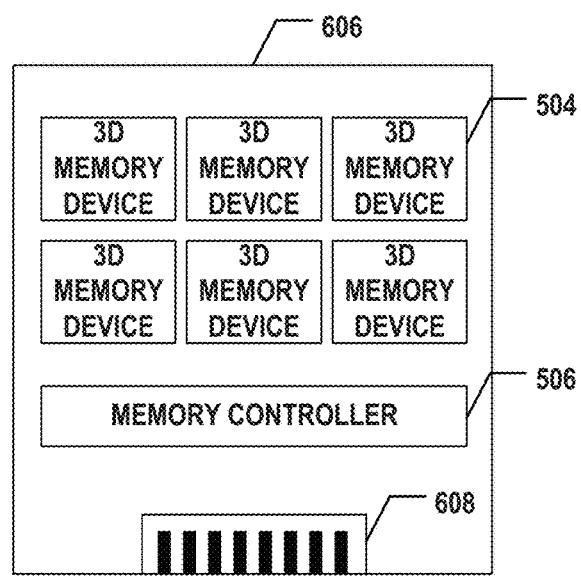
FIG. 6B illustrates a diagram of an exemplary solid-state drive (SSD) having a 3D memory device, according to some aspects of the present disclosure.

Memory controller 506 and one or more 3D memory devices 504 can be integrated into various types of storage devices, for example, be included in the same package, such as a universal Flash storage (UFS) package or an eMMC package. That is, memory system 502 can be implemented as and packaged into different types of end electronic products. In one example as shown in FIG. 6A, memory controller 506 and a single 3D memory device 504 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, mini SD, microSD, SDHC), a UFS, etc. Memory card 602 can further include a memory card connector 604 electrically coupling memory card 602 with a host (e.g., host 508 in FIG. 5). In another example as shown in FIG. 6B, memory controller 506 and multiple 3D memory devices 504 may be integrated into an SSD 606. SSD 606 can further include an SSD connector 608 electrically coupling SSD 606 with a host (e.g., host 508 in FIG. 5). In some implementations, the storage capacity and/or the operation speed of SSD 606 is greater than those of memory card 602.

FIGS. 3A-3I illustrate a fabrication process for forming an exemplary 3D memory device, according to some implementations of the present disclosure. FIG. 4 illustrates a flowchart of a method 400 for forming an exemplary 3D memory device, according to some implementations of the present disclosure. Examples of the 3D memory device depicted in FIGS. 3A-3I and 4 include 3D memory devices 100 through 100-5 depicted in FIGS. 1A to 2F. FIGS. 3A-3I and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

According to the present disclosure, two separate semiconductor assemblies (hereinafter respectively referred to as the "first semiconductor assembly" and the "second semiconductor assembly") are provided during the fabrication of the 3D memory devices. In some implementations, these two semiconductor assemblies are parallelly prepared, thus saving the processing time by a significant amount as compared to preparing them sequentially.

Figure 3A:
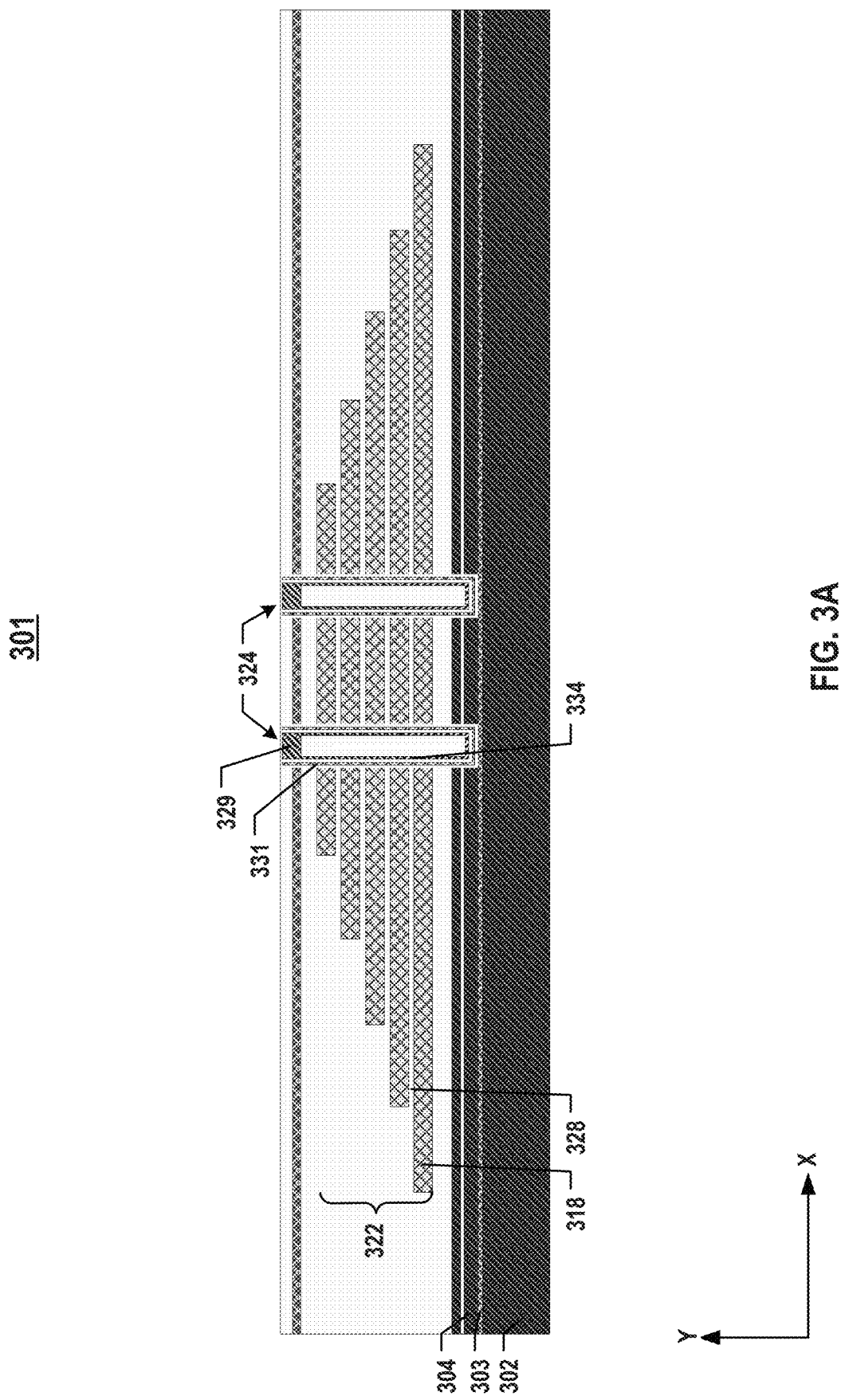
FIGS. 3A-3I illustrate a fabrication process for forming an exemplary 3D memory device, according to some implementations of the present disclosure.
Figure 4:
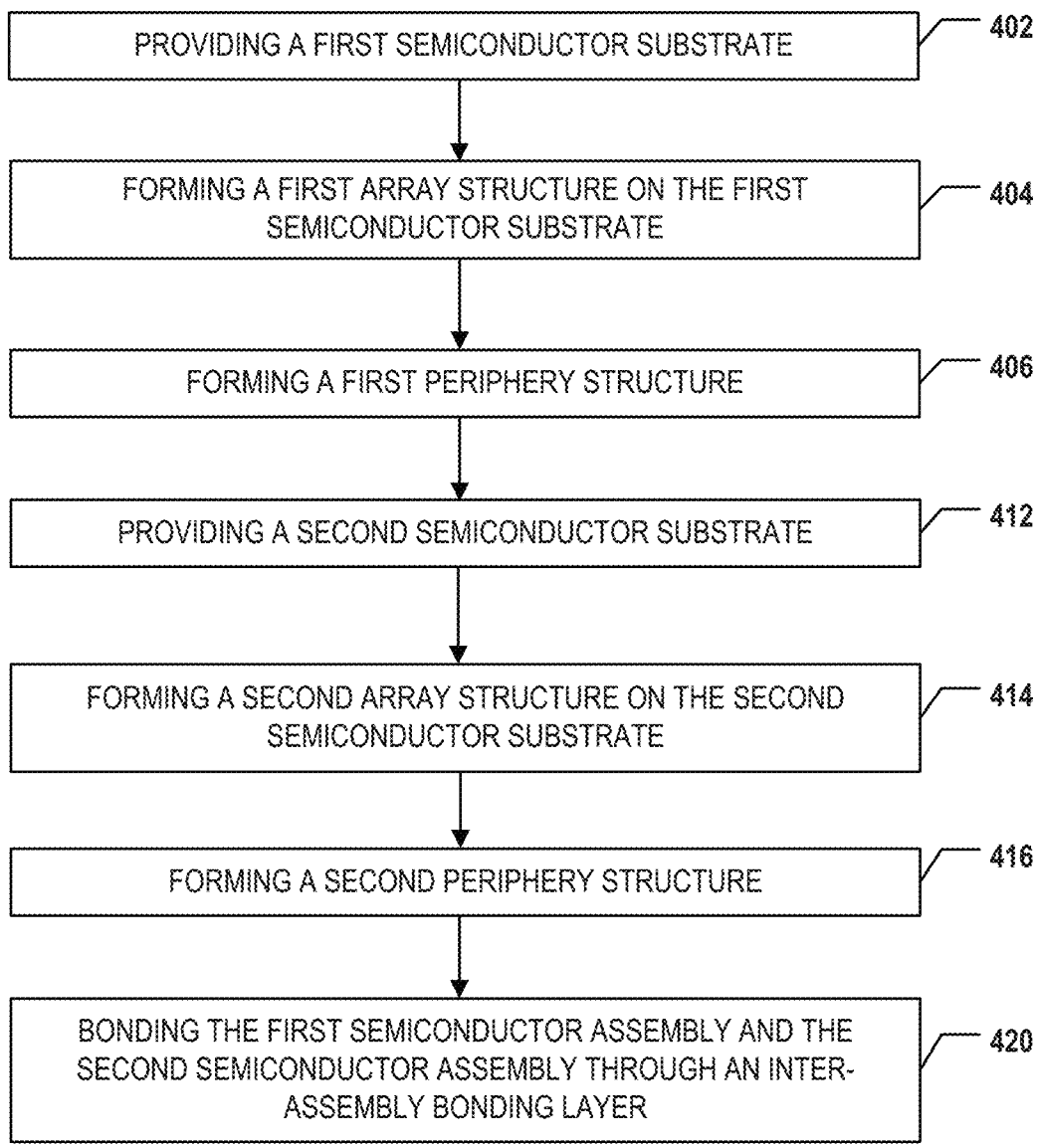
FIG. 4 illustrates a flowchart of a method for forming an exemplary 3D memory device, according to some aspects of the present disclosure.

Referring to FIGS. 3A and 4, with respect to the preparation of the first semiconductor assembly, method 400 starts at operation 402, in which a first semiconductor substrate 301 is provided. First semiconductor substrate 301 may include a carrier substrate 302, a stop layer 303 formed above carrier substrate 302, and a filling layer 304 formed over stop layer 303. Carrier substrate 302 may be removed from the final product. Carrier substrate 302 may be a part of a dummy wafer and may be made of any suitable materials, such as glass, sapphire, plastic, silicon, to name a few, to reduce the cost thereof. Filling layer 304 can include polysilicon, a high-k dielectric, or a metal. As described below in detail, stop layer 303 can act as an etch stop layer when etching the memory films of channel structures from the frontside or when removing carrier substrate 302 from the backside. Stop layer 303 may include any dielectric materials including, but not limited to, silicon oxide, silicon nitride, silicon oxynitride, low-k dielectrics, or any combination thereof. It is understood that in some examples, pad oxide layers (e.g., silicon oxide layers) may be formed between carrier substrate 302 and stop layer 303 to relax the stress between different layers and avoid peeling. As shown in FIG. 3A, stop layer 303 can be formed on carrier substrate 302 using one or more thin film deposition processes including, but not limited to, chemical vapor deposition (CVD), physical vapor deposition (PVD), atomic layer deposition (ALD), or any combination thereof. In some implementations, filling layer 304 is formed by depositing polysilicon, or any other suitable materials, such as a high-k dielectric or a metal, on stop layer 303 using one or more thin film deposition processes including, but not limited to, CVD, PVD, ALD, or any combination thereof.

Method 400 proceeds to operation 404, in which a first array structure is formed on first semiconductor substrate 301. At the beginning of this operation, a first memory stack having a plurality of interleaved stack conductive layers and stack dielectric layers may be formed as part of the first array structure on semiconductor substrate 301. This process involves providing a dielectric stack 322, which includes a plurality pairs of a first dielectric layer 318 (referred to herein as "stack sacrificial layer 318") and a second dielectric layer 328 (referred to herein as "stack dielectric layer 328", together referred to herein as "dielectric layer pairs") may be formed over filling layer 304. Dielectric stack 322 may include interleaved stack sacrificial layers 318 and stack dielectric layers 328, according to some implementations. In some implementations, stack sacrificial layers 318 are subsequently replaced by stack conductive layers 326, which will be discussed in detail below. Stack dielectric layers 328 and stack sacrificial layers 318 can be alternatingly deposited over filling layer 304 above carrier substrate 302 and stop layer 303 to form dielectric stack 322. In some implementations, each stack dielectric layer 328 includes a layer of silicon oxide, and each stack sacrificial layer 318 includes a layer of silicon nitride. Dielectric stack 322 can be formed by one or more thin film deposition processes including, but not limited to, CVD, PVD, ALD, or any combination thereof. Thus, a staircase structure can be formed on the edge of dielectric stack 322, as shown in FIG. 3A. The staircase structure can be formed by performing a plurality of so-called "trim-etch" cycles to the dielectric layer pairs of dielectric stack 322 toward carrier substrate 302. Due to the repeated trim-etch cycles applied to the dielectric layer pairs of dielectric stack 322, dielectric stack 322 can have one or more tilted edges and a top dielectric layer pair shorter than the bottom one.

In some implementations, a plurality of channel structures 324 extending vertically through dielectric stack 322 and filling layer 304 can be formed. Each channel structure 324 can include a memory film 331 and a semiconductor channel 334. In some implementations, to form channel structure 334, a channel hole extending vertically through dielectric stack 322, filling layer 304, and stop layer 303 is formed, and memory film 331 and semiconductor channel 334 are sequentially formed along a sidewall and a bottom surface of the channel hole. Each channel hole is an opening extending vertically through dielectric stack 322, filling layer 304, and stop layer 303, stopping at stop layer 303. In some implementations, a plurality of openings are formed, such that each opening becomes the location for growing an individual channel structure 324 in the later process. In some implementations, fabrication processes for forming the channel holes of channel structures 324 include wet etching and/or dry etching, such as deep RIE (DRIE). The etching of the channel holes continues until being stopped by stop layer 303. In some implementations, the etching conditions, such as etching rate and time, can be controlled to ensure that each channel hole has reached and stopped by stop layer 303 to minimize the gouging variations among the channel holes and channel structures 324 formed therein. It is understood that depending on the specific etching selectivity, one or more channel holes may extend into stop layer 303 to a small extent, which is still viewed as being stopped by stop layer 303 in the present disclosure.

In some implementations, memory film 331 including a blocking layer, a storage layer, and a tunneling layer, and semiconductor channel 334 are sequentially formed in this order along sidewalls and the bottom surface of the channel hole. In some implementations, the blocking layer, the storage layer, and the tunneling layer are first deposited along the sidewalls and bottom surface of the channel hole in this order using one or more thin film deposition processes, such as ALD, CVD, PVD, any other suitable processes, or any combination thereof, to form memory film 331. Semiconductor channel 334 can then be formed by depositing a semiconductor material, such as polysilicon (e.g., undoped polysilicon), over the tunneling layer using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are sequentially deposited to form the blocking layer, the storage layer, and the tunneling layer of memory film 331 and semiconductor channel 334.

In some implementations, a capping layer is formed in the channel hole and over semiconductor channel 334 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug 329 can then be formed in the top portion of the channel hole. In some implementations, parts of memory film 331, semiconductor channel 334, and the capping layer that are on the top surface of the dielectric stack are removed and planarized by chemical mechanical polishing (CMP), wet etching, and/or dry etching. A recess then can be formed in the top portion of the channel hole by wet etching and/or drying etching parts of semiconductor channel 334 and the capping layer in the top portion of the channel hole. Channel plug 329 can then be formed by depositing semiconductor materials, such as polysilicon, into the recess by one or more thin film deposition processes, such as CVD, PVD, ALD, or any combination thereof. Channel structure 324 is thereby formed through dielectric stack 322, filling layer 304, and stop layer 303, stopping at stop layer 303, according to some implementations.

Figure 3B:
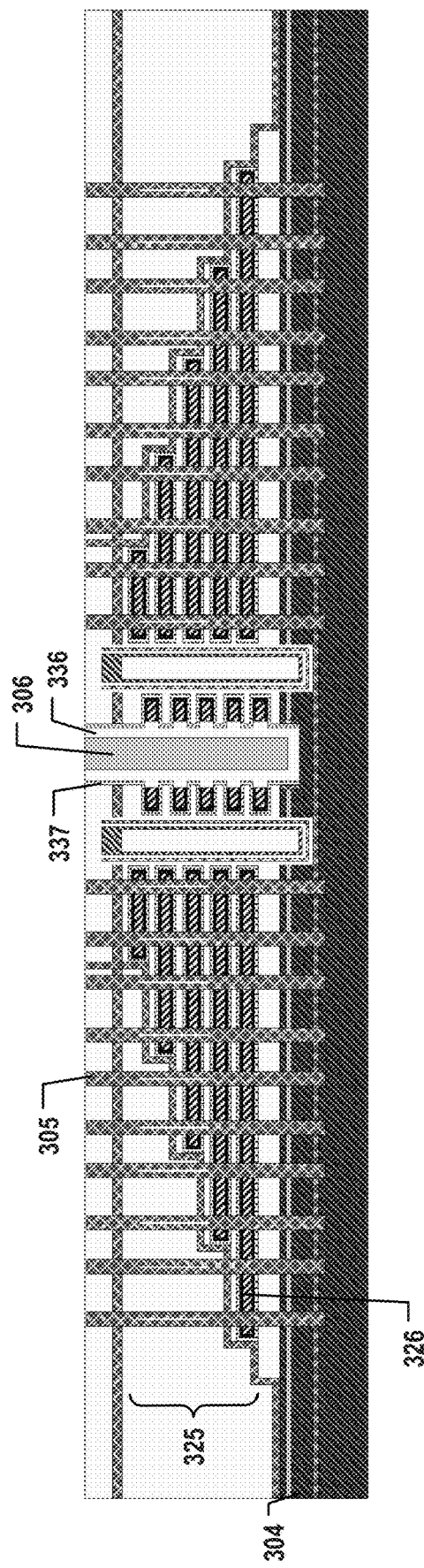

Referring to FIG. 3B, a plurality of dummy channel structures 305 may be provided in substrate 301. In some implementations, dummy channel structures 305 are formed in areas other than where channel structures 324 are located. For example, dummy channel structures 305 may be formed in a manner that extend vertically through the staircase structure area, without cutting through stack conductive layers 326 or stack dielectric layers 328. Dummy channel structures 305 may be formed by etching dummy holes and filling in the dummy holes with dielectric materials. Dummy channel structures 305 may provide support to the semiconductor structure (such as an array structure) formed in the substrate and prevent the bending of electrical wiring inside the substrate.

In some implementations, a slit 336 is formed that extends vertically through dielectric stack 322 (shown in FIG. 3A) and stops at filling layer 304. In some implementations, fabrication processes for forming slit 336 include wet etching and/or dry etching, such as DRIE. A gate replacement then can be performed through slit 336 to replace dielectric stack 322 with a memory stack 325. Specifically, lateral recesses (not shown) are first formed by removing stack sacrificial layers 318 through slit 336. In some implementations, stack sacrificial layers 318 are removed by applying etchants through slit 336, creating lateral recesses interleaved between stack dielectric layers 328. The etchants can include any suitable etchants that etch stack sacrificial layers 318 selective to stack dielectric layers 328.

In some implementations, stack conductive layers 326 (including gate electrodes and adhesive layers) are deposited into the lateral recesses through slit 336. In some implementations, a gate dielectric layer 337 is deposited into the lateral recesses prior to stack conductive layers 326, such that stack conductive layers 326 are deposited on gate dielectric layer 337. Stack conductive layers 326, such as metal layers, can be deposited using one or more thin film deposition processes, such as ALD, CVD, PVD, any other suitable processes, or any combination thereof. In some implementations, gate dielectric layer 337, such as a high-k dielectric layer, is formed along the sidewall and at the bottom of slit 336 as well. Memory stack 325 including interleaved stack conductive layers 326 and stack dielectric layers 328 is thereby formed, replacing dielectric stack 322, according to some implementations.

In some implementations, an insulating structure 306 extending vertically through memory stack 325 is formed, stopping on the top surface of filling layer 304. Insulating structure 306 can be formed by depositing one or more dielectric materials, such as silicon oxide, into slit 336 to fully or partially fill slit 336 (with or without an air gap) using one or more thin film deposition processes, such as ALD, CVD, PVD, any other suitable processes, or any combination thereof. In some implementations, insulating structure 306 includes gate dielectric layer 337 (e.g., including high-k dielectrics) and a dielectric capping layer (not shown) (e.g., including silicon oxide). Although not shown, in some examples, the dielectric capping layer may partially fill slit 336, and a polysilicon core layer (not shown) may fill the remaining space of slit 336 as part of insulating structure 306 to adjust the mechanical properties, such as hardness or stress, of insulating structure 306.

Figure 3C:
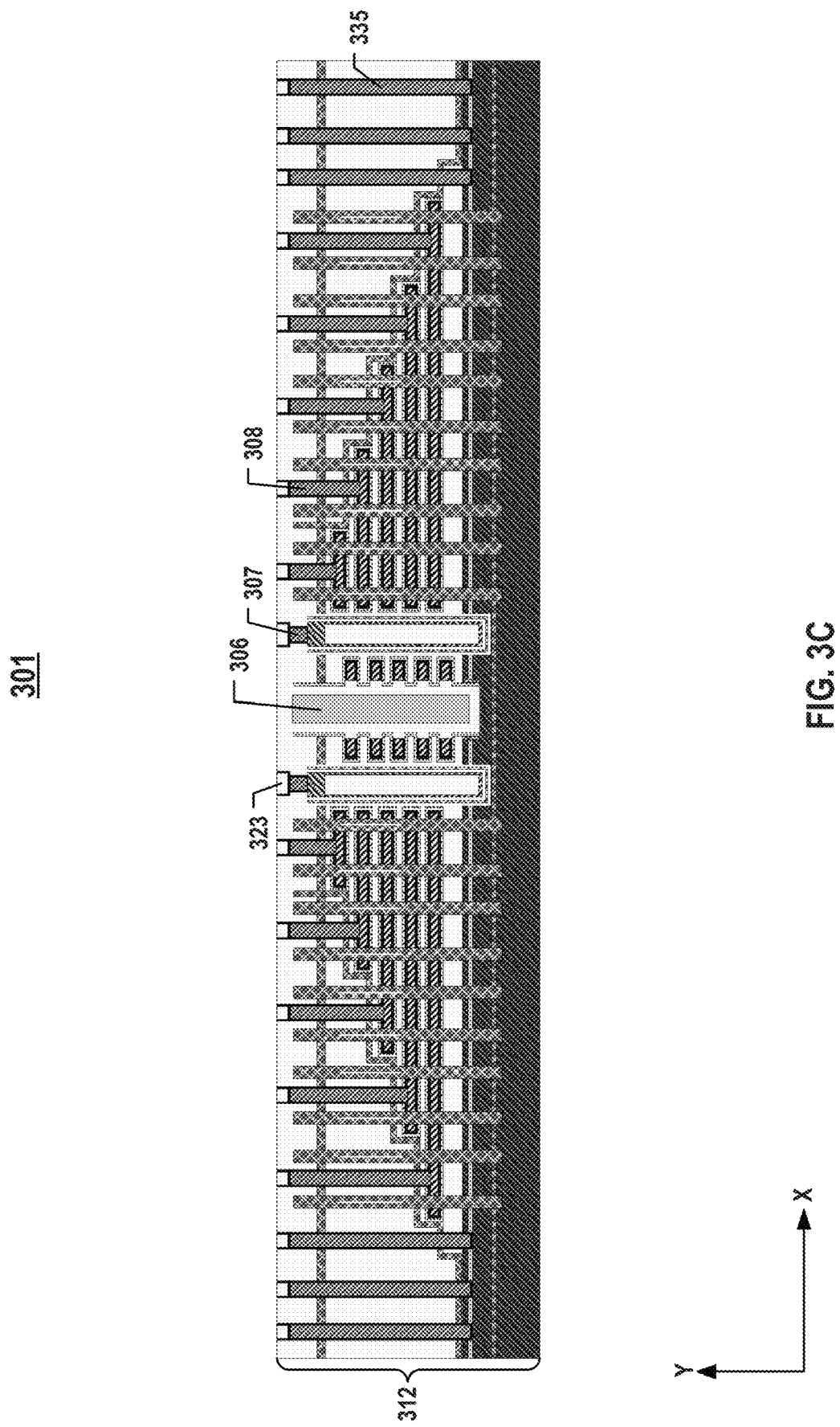

Referring to FIG. 3C, after the formation of insulating structure 306, peripheral contacts 335, local contacts (including channel local contacts 307 and word line local contacts 308), and interface contacts 323 (e.g., MEOL contacts and/or BEOL contacts) are formed from the lower portion to the upper portion of semiconductor substrate 301. Peripheral contacts 335, channel local contacts 307, word line local contacts 308, and interface contacts 323 can be formed by etching contact openings using wet etching and/or dry etching, e.g., RIE, followed by filling the contact openings with conductive materials using one or more thin film deposition processes, such as ALD, CVD, PVD, any other suitable processes, or any combination thereof. Contact materials may include, but not limited to W, Co, Cu, Al, silicides, or any combination thereof. In some implementations, the upper surfaces of interface contacts 323 are flush with the upper surface of semiconductor substrate 301 at this operation. Thus, the basic structure of a first array structure 312 is formed.

Figure 3D:
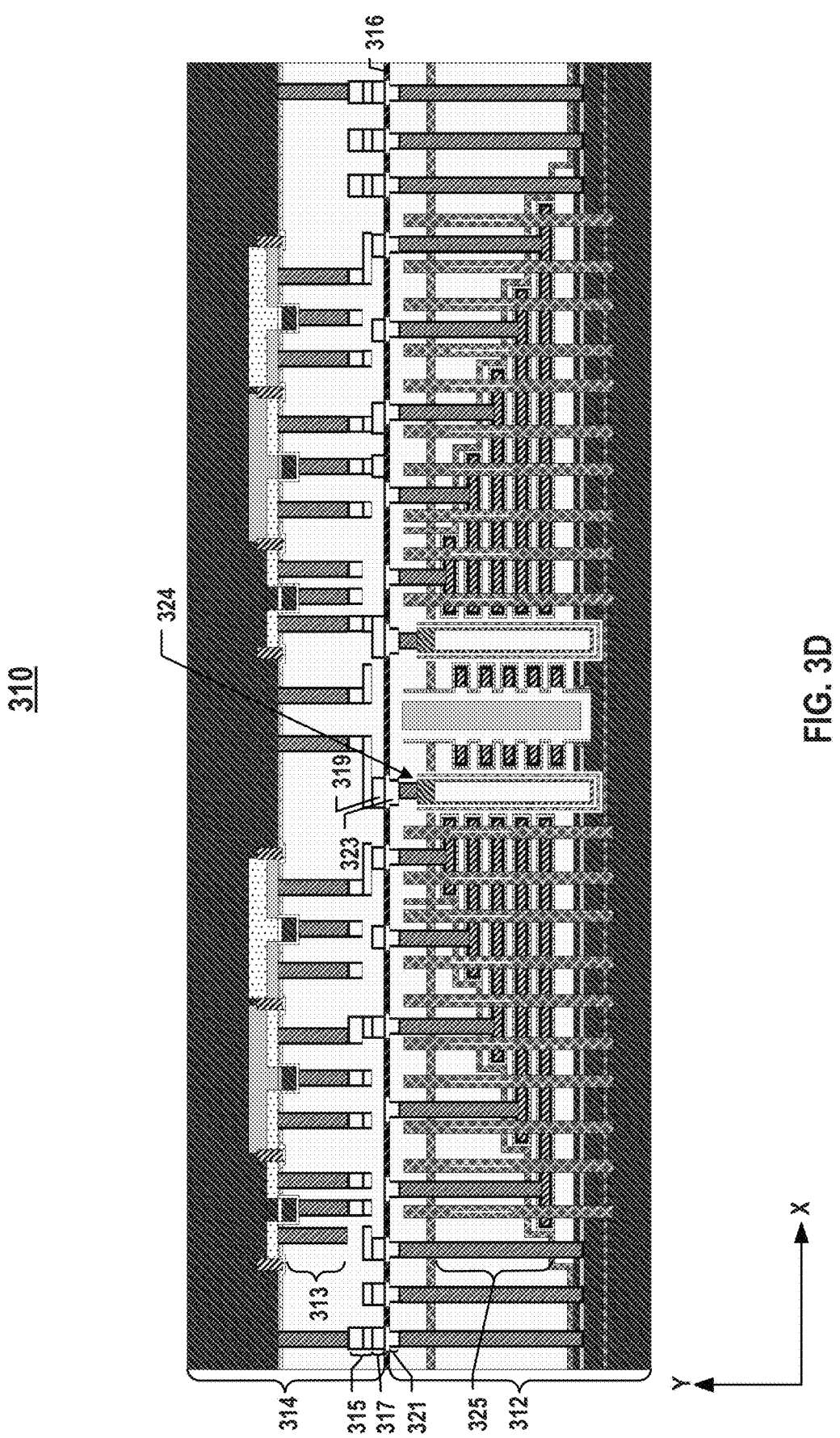

Method 400 proceeds to operation 406, in which a first periphery structure 314 (as shown in FIG. 3D) is formed. In some implementations, first periphery structure 314 may be formed directly over first array structure 312 and an interface layer using a novel fabrication technology, in which a plurality of peripheral circuits may be formed over the interface layer which in turn may be formed over first array structure. In some other implementations, first periphery structure 314 may be formed separately and then bonded with first array structure 312 at a bonding interface. In still other implementations, first periphery structure 314 and first array structure 312 are formed simultaneously, therefore saving fabrication time. Either way, first periphery structure 314 is adjacent to first array structure 312 and includes a plurality of peripheral circuits electrically connected to memory stack 325, according to the present disclosure.

Referring to FIG. 3D and using bonding formation as an example, after first array structure 312 is formed, first periphery structure 314 can be bonded with first array structure 312 at a bonding interface 316. First periphery structure 314 may be separately formed on a substrate, which can be a silicon substrate. A plurality of transistors may be formed on the silicon substrate using a plurality of processes including, but not limited to, photolithography, etching, thin film deposition, thermal growth, implantation, chemical mechanical polishing (CMP), and any other suitable processes. In some implementations, doped regions are formed in the silicon substrate by ion implantation and/or thermal diffusion, which function, for example, as source regions and/or drain regions of the transistors. In some implementations, isolation regions (e.g., STIs) are also formed in the silicon substrate by wet etching and/or dry etching and thin film deposition. The transistors can form the plurality of peripheral circuits 313 of first periphery structure 314.

In some implementations, an interconnect layer 315 is formed beneath peripheral circuits 313 to transfer electrical signals to and from peripheral circuits 313. Interconnect layer 315 can include a plurality of interconnects (also referred to herein as contacts), including lateral interconnect lines and VIA contacts. Interconnect layer 315 can further include one or more ILD layers in which the interconnect lines and VIA contacts can form. That is, interconnect layer 315 can include interconnect lines and VIA contacts in multiple ILD layers. The interconnect lines and VIA contacts in interconnect layer 315 can include conductive materials including, but not limited to, W, Co, Cu, Al, silicides, or any combination thereof. The ILD layers in interconnect layer 315 can include dielectric materials including, but not limited to, silicon oxide, silicon nitride, silicon oxynitride, low dielectric constant (low-k) dielectrics, or any combination thereof.

In some implementations, a bonding layer 317 is formed in first periphery structure 314 and beneath interconnect layer 315 and peripheral circuits 313. Bonding layer 317 can include a plurality of interface contacts 319 and dielectrics electrically isolating interface contacts 319. Interface contacts 319 can include conductive materials including, but not limited to, W, Co, Cu, Al, silicides, or any combination thereof. The remaining area of bonding layer 317 can be formed with dielectrics including, but not limited to, silicon oxide, silicon nitride, silicon oxynitride, low-k dielectrics, or any combination thereof. Interface contacts 319 and surrounding dielectrics in bonding layer 317 can be used for hybrid bonding. To form bonding layer 317, an ILD layer is deposited using one or more thin film deposition processes, such as ALD, CVD, PVD, or any combination thereof interface contacts 319 are formed using wet etching and/or dry etching, e.g., reactive ion etching (RIE), followed by one or more thin film deposition processes, such as ALD, CVD, PVD, any other suitable processes, or any combination thereof.

In some implementations, first array structure 312 may include a bonding layer 321 adjacent to bonding interface 316. Bonding layer 321 includes a plurality of interface contacts 323 and dielectrics electrically isolating interface contacts 323, as shown in FIG. 3D. The compositions and formation of bonding layer 321 may be the same as bonding layer 317, and thus will not be repeated herein.

In some implementations, first array structure 312 and first periphery structure 314 are bonded in a face-to-face manner, such that peripheral circuits 313 are above memory stack 325. The bonding can include hybrid bonding. Bonding layer 317 facing down can be bonded with bonding layer 321 facing up, thereby forming a bonding interface 316 between first array structure 312 and first periphery structure 314. In some implementations, a treatment process, e.g., a plasma treatment, a wet treatment, and/or a thermal treatment, is applied to the bonding surfaces prior to the bonding. After the bonding, interface contacts 319 in bonding layer 317 and interface contacts 323 in bonding layer 321 are aligned and in contact with one another, such that memory stack 325 and channel structures 324 formed therethrough can be electrically connected to peripheral circuits 313. Thus, the basic structure of first semiconductor assembly 310 is formed.

Figure 3E:
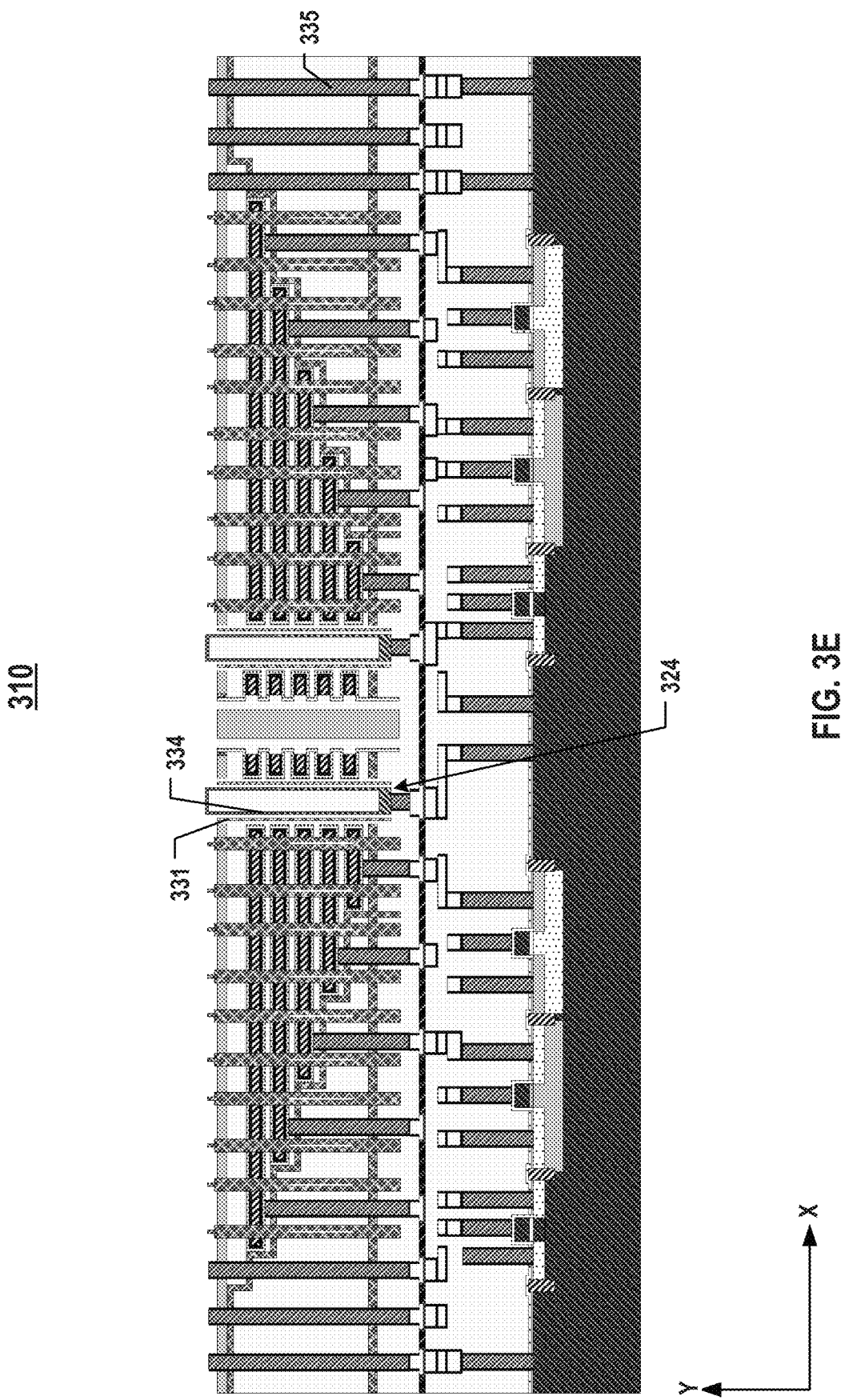

Referring to FIG. 3E, first semiconductor assembly 310 is flipped upside down. Subsequently, a portion of semiconductor substrate 301 from a side of first array structure 312 can be removed, so that one or more peripheral contacts 335 in first array structure 312 can be exposed. In some implementations, one or more of carrier substrate 302, stop layer 303, and filling layer 304 are removed. Carrier substrate 302 can be removed by CMP, grinding, dry etching, and/or wet etching. In some implementations, carrier substrate 302 can be peeled off. In some implementations in which carrier substrate 302 includes silicon and stop layer 303 includes silicon nitride, carrier substrate 302 is removed by silicon CMP, which can be automatically stopped when reaching stop layer 303 having materials other than silicon, i.e., acting as a backside CMP stop layer. In some implementations, carrier substrate 302 (a silicon substrate) is removed by wet etching using tetramethylammonium hydroxide (TMAH), which is automatically stopped when reaching stop layer 303 having materials other than silicon, i.e., acting as a backside etch stop layer. Stop layer 303 can ensure the complete removal of carrier substrate 302 without the concern of thickness uniformity after thinning.

In some implementations, stop layer 303 is removed by using, for example, wet etching by phosphoric acid, CMP, or grinding, after removal of carrier substrate 302. Filling layer 304 may be removed by using, for example, dry etching, and/or wet etching. As a result, parts of channel structures 324 and peripheral contacts 335 are exposed. The exposed parts of channel structures 324 may include the top portions of memory film 331 (including the blocking layer, the storage layer, and the tunneling layer) and semiconductor channel 334 with respect to each channel structure 324. In some implementations, the exposed top portion of semiconductor channel 334 is doped to increase conductivity. For example, a tilted ion implantation process may be performed to dope the top portion of semiconductor channel 334 (e.g., including polysilicon) with any suitable dopants (e.g., N-type dopants such as P, As, or Sb) to a desired doping concentration, thus creating a doped portion and leaving the rest of semiconductor channel 334 as an undoped portion.

Figure 3F:
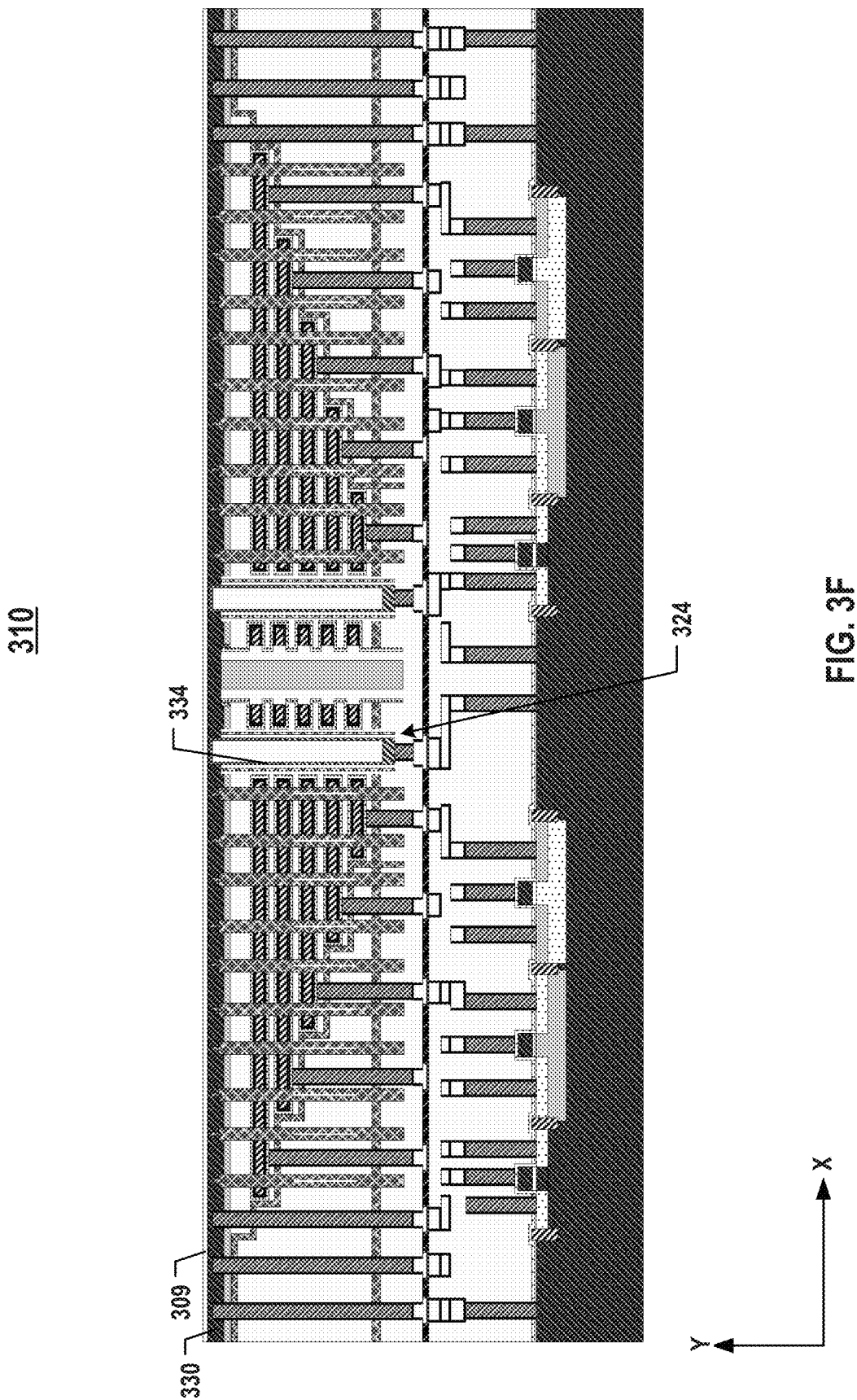

Referring to FIG. 3F, a doped semiconductor layer 330 may be subsequently formed on the surface of semiconductor substrate 301. For example, a semiconductor layer (e.g., polysilicon) is deposited over the surface of semiconductor substrate 301 using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion. In some implementations, to form doped semiconductor layer 330, in-situ doping of N-type dopants, such as P, As, or Sb, is performed when depositing the semiconductor layer over the surface of semiconductor substrate 301. In some implementations, a CMP process can be performed to remove any excess doped semiconductor layer 330 as needed. Doped semiconductor layer 330 may be formed to be in contact with channel structures 324. In some implementations, doped semiconductor layer 330 is formed in touch with semiconductor channel 334.

Subsequently, an ILD layers 309 may be formed on doped semiconductor layer 330. ILD layer 309 can be formed by depositing dielectric materials on the top surface of doped semiconductor layer 330 using one or more thin film deposition processes, such as ALD, CVD, PVD, any other suitable processes, or any combination thereof.

Figure 3G:
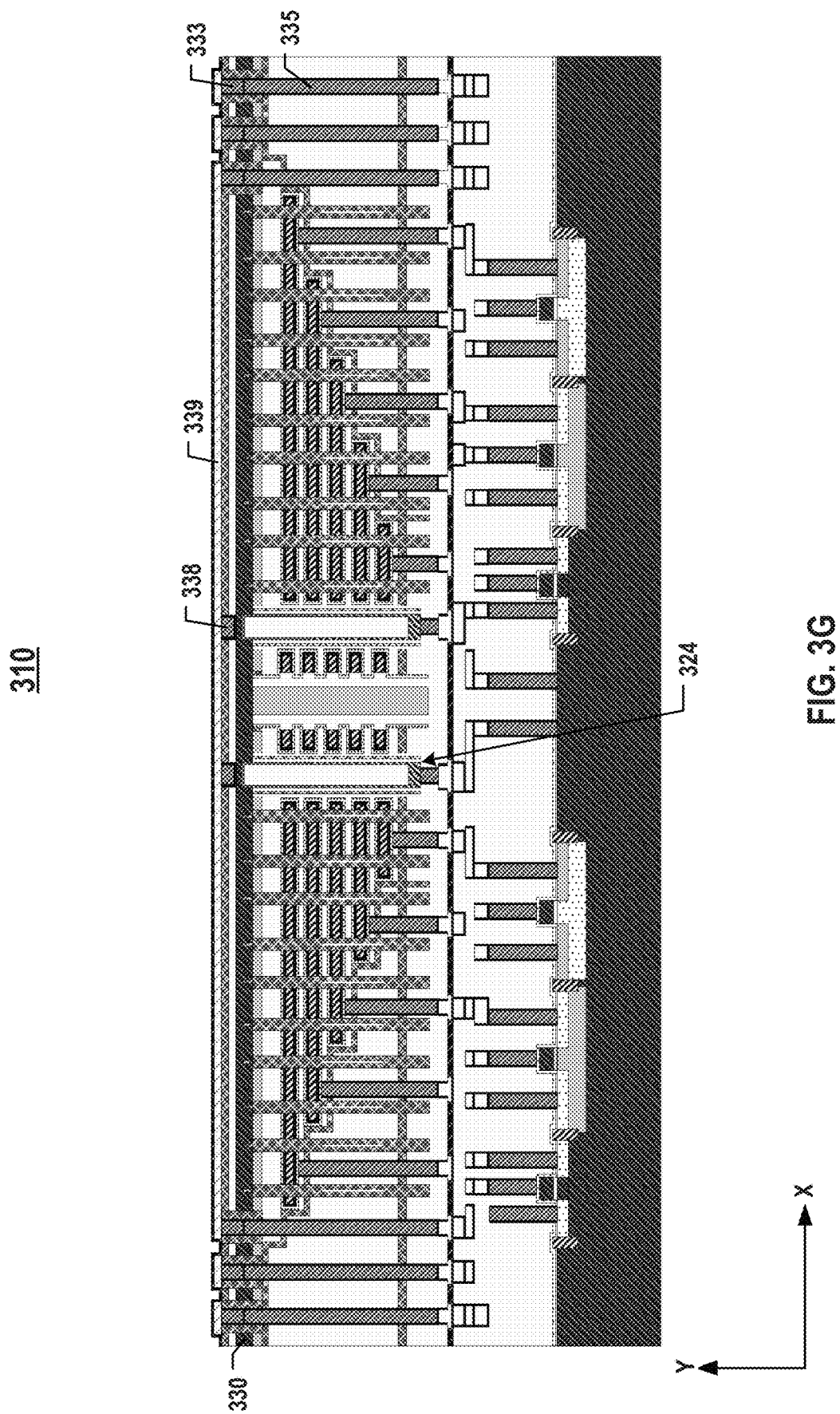

Referring to FIG. 3G, multiple contact openings (not shown) can be formed to expose various components on the upper surface of first semiconductor assembly 310, such as peripheral contacts 335, and portions of doped semiconductor layer 330 with channel structures 324 disposed underneath. In some implementations, the contact openings are formed using wet etching and/or dry etching, such as RIE. As shown in FIG. 3G, a conductive layer is formed in the contact openings, thus forming source contacts 338 and contacts 333. Source contacts 338 are above and in contact with doped semiconductor layer 330, according to some implementations. In some implementations, the conductive layer, such as Al or Cu, is deposited into the contact openings using one or more thin film deposition processes, such as ALD, CVD, PVD, any other suitable processes, or any combination thereof, to fill the contact openings. A planarization process, such as CMP, can then be performed to remove the excess conductive layer. Subsequently, a passivation layer 339 can be formed over contacts 333 and source contacts 338.

Figure 3H:
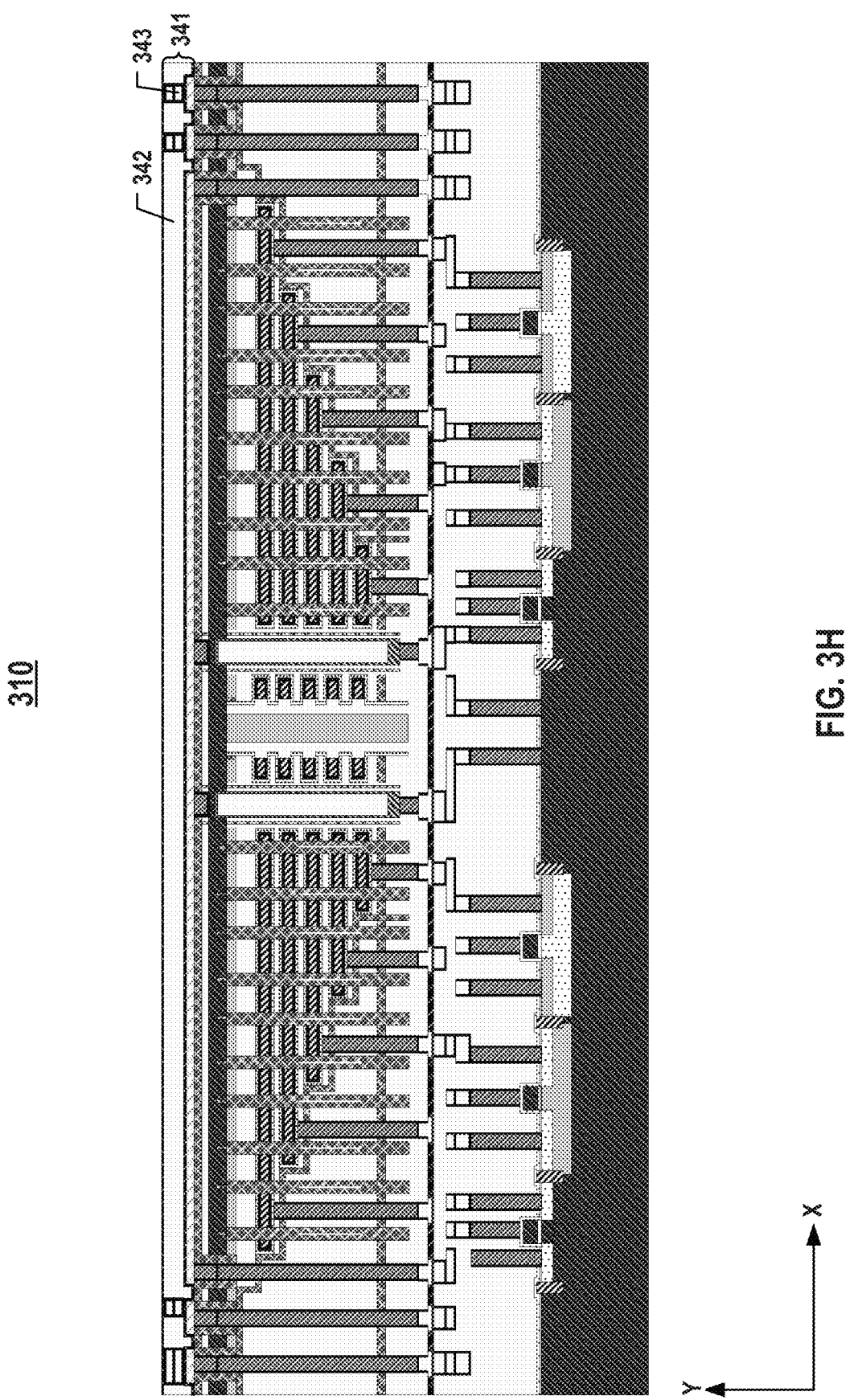

Referring to FIG. 3H, a bonding layer 342 can be formed over the surface of and adjacent to first semiconductor assembly 310 by using one or more thin film deposition processes, such as ALD, CVD, PVD, any other suitable processes, or any combination thereof. Bonding layer 342 can be formed with dielectrics including, but not limited to, silicon oxide, silicon nitride, silicon oxynitride, low-k dielectrics, or any combination thereof. Then a plurality of openings can be etched to allow the formation of a bonding contact 343 therein. In some implementations, a conductive layer, such as Al or Cu, is deposited into the openings using one or more thin film deposition processes, such as ALD, CVD, PVD, any other suitable processes, or any combination thereof, to fill the contact openings. A planarization process, such as CMP, can then be performed to remove the excess conductive layer. Thus, bonding contact 343 can be embedded within bonding layer 342. Thus, a first portion 341 of inter-assembly bonding layer 340 can be formed.

Figure 3I:
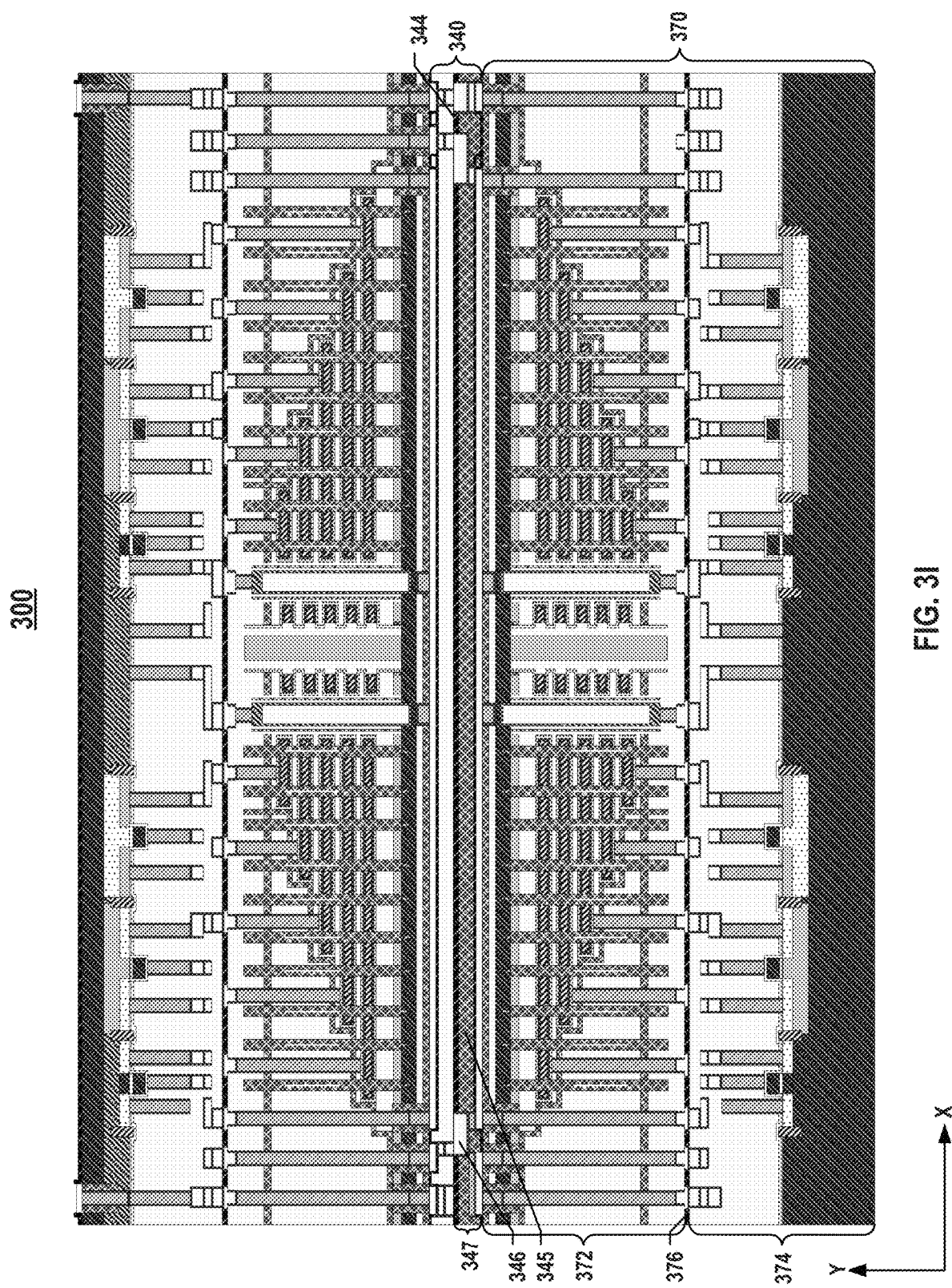

In some implementations, bonding contact 343 is formed at locations of inter-assembly bonding layer 340 under which no memory stacks 325, channel structures 324, or insulating structures 306 are vertically located, as shown in FIG. 3H. Thus, according to the present disclosure, bonding contact 343 may be provided in inter-assembly bonding layer 340 at a location laterally away from both the memory stacks of both semiconductor assemblies 310, 370 (as shown in FIG. 3I). This configuration has the advantage that bonding contact 343 is directly positioned between the first and second peripheral circuits of both semiconductor assemblies 310, 370, thereby getting rid of unnecessary wiring and shortening the signal transmission time.

Referring to FIG. 3I, method 400 proceeds to operation 412, in which a second semiconductor substrate (not shown) is provided. At operation 414, a second array structure 372 can be formed on the second semiconductor substrate. Second array structure can include a second memory stack having a plurality of interleaved stack conductive layers and stack dielectric layers. At operation 416, a second periphery structure 374 can be formed. Second periphery structure 374 can be adjacent to second array structure 372 and include a plurality of peripheral circuits electrically connected to the second memory stack. Second array structure 372 and second periphery structure 374 can be bonded through a bonding interface 376, thus forming second semiconductor assembly 370. According to the present disclosure, the formation of various components and the configuration of second semiconductor assembly 370 are identical to those of first semiconductor assembly 310, and thus will not be repeated herein.

In some implementations, a bonding layer 345 can be formed over the surface of and adjacent to second semiconductor assembly 370 by using one or more thin film deposition processes, such as ALD, CVD, PVD, any other suitable processes, or any combination thereof. Bonding layer 345 can be formed with dielectrics including, but not limited to, silicon oxide, silicon nitride, silicon oxynitride, low-k dielectrics, or any combination thereof. Then a plurality of openings can be etched to allow the formation of a bonding contact 346 therein. In some implementations, a conductive layer, such as Al or Cu, is deposited into the openings using one or more thin film deposition processes, such as ALD, CVD, PVD, any other suitable processes, or any combination thereof, to fill the contact openings. A planarization process, such as CMP, can then be performed to remove the excess conductive layer. Thus, bonding contact 346 can be embedded within bonding layer 345. Thus, a second portion 347 of inter-assembly bonding layer 340 can be formed.

Method 400 proceeds to operation 420, in which first semiconductor assembly 310 and second semiconductor assembly 370 are bonded through inter-assembly bonding layer 340. In some implementations, first portion 341 adjacent to first semiconductor assembly 310 and second portion 347 adjacent to second semiconductor assembly 370 are bonded in a face-to-face manner at bonding interface 344. Various bonding technologies may be employed to join two semiconductor assemblies 310 and 370, such as hybrid bonding, anodic bonding, fusion bonding, adhesive bonding, etc. Thus, a 3D memory device 300 according to the present disclosure is manufactured using method 400.

According to one aspect of the present disclosure, a 3D memory device includes a first semiconductor assembly, a second semiconductor assembly, and an inter-assembly bonding layer between the first semiconductor assembly and the second semiconductor assembly. The first semiconductor assembly includes a first array structure and a first periphery structure. The first array structure includes a first memory stack having a plurality of interleaved stack conductive layers and stack dielectric layers. The first periphery structure includes a plurality of first peripheral circuits electrically connected to the first memory stack. The second semiconductor assembly includes a second array structure and a second periphery structure. The second array structure includes a second memory stack having a plurality of interleaved stack conductive layers and stack dielectric layers. The second periphery structure includes a plurality of second peripheral circuits electrically connected to the second memory stack.

In some implementations, the inter-assembly bonding layer includes a conductive material and a dielectric material.

In some implementations, the inter-assembly bonding layer includes a first portion adjacent to the first semiconductor assembly and a second portion adjacent to the second semiconductor assembly. The first portion includes a first bonding contact embedded within a first bonding layer of the first portion. The second portion includes a second bonding contact embedded within a second bonding layer of the second portion.

In some implementations, the first bonding contact and the second bonding contact jointly serve as an electrical connection between the first semiconductor assembly and the second semiconductor assembly.

In some implementations, at least one of the plurality of first peripheral circuits is electrically connected to at least one of the plurality of second peripheral circuits via the bonding contacts of the inter-assembly bonding layer.

In some implementations, the bonding contacts are provided in the inter-assembly bonding layer at a location laterally away from both the first memory stack and the second memory stack.

In some implementations, the first array structure is vertically more adjacent to the inter-assembly bonding layer than the first periphery structure.

In some implementations, the second array structure is vertically more adjacent to the inter-assembly bonding layer than the second periphery structure.

In some implementations, at least one of the first array structure and the second array structure includes a channel structure extending vertically through one of the first and second memory stacks and a semiconductor layer. The channel structure is in contact with a doped semiconductor layer disposed above the memory stack corresponding to the array structure comprising the channel structure.

In some implementations, the doped semiconductor layer includes doped polysilicon.

In some implementations, at least one of the first array structure and the second array structure includes a channel structure extending vertically through one of the first and second memory stacks and a semiconductor layer. A semiconductor channel along a sidewall of the channel structure is in contact with a sublayer of the semiconductor layer.

In some implementations, at least one of the first array structure and the second array structure includes a channel structure having a semiconductor channel and a semiconductor plug. The semiconductor plug is in contact with the semiconductor channel.

In some implementations, the channel structure of the first array structure and the channel structure of the second channel structure are symmetric about the inter-assembly bonding layer.

In some implementations, a substrate is provided on a side of one of the first semiconductor assembly and the second semiconductor assembly. The semiconductor substrate faces away from the inter-assembly bonding layer.

In some implementations, a pad-out contact layer is provided on a side of the other of the first semiconductor assembly and the second semiconductor assembly. The pad-out contact layer faces away from the inter-assembly bonding layer and is configured to transfer electrical signals between the 3D memory device and an external circuit.

According to another aspect of the present disclosure, a method for forming a 3D memory device is provided. A first semiconductor substrate is provided, a first array structure is formed on the first semiconductor substrate, and a first periphery structure is formed adjacent to the first array structure, thus providing a first semiconductor assembly. The first array structure includes a first memory stack having a plurality of interleaved stack conductive layers and stack dielectric layers. The first periphery structure includes a plurality of first peripheral circuits electrically connected to the first memory stack. A second semiconductor substrate is provided, a second array structure is formed on the second semiconductor substrate, and a second periphery structure is formed adjacent to the second array structure, thus providing a second semiconductor assembly. The second array structure includes a second memory stack having a plurality of interleaved stack conductive layers and stack dielectric layers. The second periphery structure includes a plurality of second peripheral circuits electrically connected to the second memory stack. The first semiconductor assembly and the second semiconductor assembly are bonded through an inter-assembly bonding layer.

In some implementations, the first array structure and the first periphery structure are bonded through a first bonding interface.

In some implementations, a portion of the first semiconductor substrate is removed from a side of the first array structure to expose one or more peripheral contacts in the first array structure.

In some implementations, a first portion of the inter-assembly bonding layer is formed adjacent to the first semiconductor assembly. The first portion includes a first bonding contact embedded within a first bonding layer.

In some implementations, the second array structure and the second periphery structure are bonded through a second bonding interface.

In some implementations, a portion of the second semiconductor substrate is removed from a side of the second array structure to expose one or more peripheral contacts in the second array structure.

In some implementations, a second portion of the inter-assembly bonding layer is formed adjacent to the second semiconductor assembly. The second portion includes a second bonding contact embedded within a second bonding layer.

In some implementations, the first portion and the second portion of the inter-assembly bonding layer are bonded.

In some implementations, at least one of the first array structure and the second array structure includes a channel structure extending vertically through one of the first and second memory stacks and a semiconductor layer. The channel structure is in contact with a doped semiconductor layer disposed above the memory stack corresponding to the array structure comprising the channel structure.

In some implementations, the doped semiconductor layer includes doped polysilicon.

In some implementations, at least one of the first array structure and the second array structure includes a channel structure extending vertically through one of the first and second memory stacks and a semiconductor layer. A semiconductor channel along a sidewall of the channel structure is in contact with a sublayer of the semiconductor layer.

In some implementations, at least one of the first array structure and the second array structure includes a channel structure having a semiconductor channel and a semiconductor plug. The semiconductor plug is in contact with the semiconductor channel.

In some implementations, the channel structure of the first array structure and the channel structure of the second channel structure are symmetric about the inter-assembly bonding layer.

According to still another aspect of the present disclosure, a system includes a 3D memory device configured to store data and a memory controller coupled to the 3D memory device and configured to control the 3D memory device. The 3D memory device includes a first semiconductor assembly, a second semiconductor assembly, and an inter-assembly bonding layer between the first semiconductor assembly and the second semiconductor assembly. The first semiconductor assembly includes a first array structure and a first periphery structure. The first array structure includes a first memory stack having a plurality of interleaved stack conductive layers and stack dielectric layers. The first periphery structure includes a plurality of first peripheral circuits electrically connected to the first memory stack. The second semiconductor assembly includes a second array structure and a second periphery structure. The second array structure includes a second memory stack having a plurality of interleaved stack conductive layers and stack dielectric layers. The second periphery structure includes a plurality of second peripheral circuits electrically connected to the second memory stack.

In some implementations, the system further includes a host coupled to the memory controller and configured to send or receive the data.

In some implementations, the inter-assembly bonding layer includes a conductive material and a dielectric material.

In some implementations, the inter-assembly bonding layer includes a first portion adjacent to the first semiconductor assembly and a second portion adjacent to the second semiconductor assembly. The first portion includes a first bonding contact embedded within a first bonding layer of the first portion. The second portion includes a second bonding contact embedded within a second bonding layer of the second portion.

In some implementations, the first bonding contact and the second bonding contact jointly serve as an electrical connection between the first semiconductor assembly and the second semiconductor assembly.

In some implementations, at least one of the plurality of first peripheral circuits is electrically connected to at least one of the plurality of second peripheral circuits via the bonding contacts of the inter-assembly bonding layer.

In some implementations, the bonding contacts are provided in the inter-assembly bonding layer at a location laterally away from both the first memory stack and the second memory stack.

In some implementations, the first array structure is vertically more adjacent to the inter-assembly bonding layer than the first periphery structure.

In some implementations, the second array structure is vertically more adjacent to the inter-assembly bonding layer than the second periphery structure.

In some implementations, at least one of the first array structure and the second array structure includes a channel structure extending vertically through one of the first and second memory stacks and a semiconductor layer. The channel structure is in contact with a doped semiconductor layer disposed above the memory stack corresponding to the array structure comprising the channel structure.

In some implementations, the doped semiconductor layer includes doped polysilicon.

In some implementations, at least one of the first array structure and the second array structure includes a channel structure extending vertically through one of the first and second memory stacks and a semiconductor layer. A semiconductor channel along a sidewall of the channel structure is in contact with a sublayer of the semiconductor layer.

In some implementations, at least one of the first array structure and the second array structure includes a channel structure having a semiconductor channel and a semiconductor plug. The semiconductor plug is in contact with the semiconductor channel.

In some implementations, the channel structure of the first array structure and the channel structure of the second channel structure are symmetric about the inter-assembly bonding layer.

In some implementations, a substrate is provided on a side of one of the first semiconductor assembly and the second semiconductor assembly. The semiconductor substrate faces away from the inter-assembly bonding layer.

In some implementations, a pad-out contact layer is provided on a side of the other of the first semiconductor assembly and the second semiconductor assembly. The pad-out contact layer faces away from the inter-assembly bonding layer and is configured to transfer electrical signals between the 3D memory device and an external circuit.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
    a first semiconductor assembly comprising:
        a first array structure comprising a first memory stack having a plurality of interleaved stack conductive layers and stack dielectric layers; and
        a first periphery structure comprising a plurality of first peripheral circuits electrically connected to the first memory stack;
    a second semiconductor assembly comprising:
        a second array structure comprising a second memory stack having a plurality of interleaved stack conductive layers and stack dielectric layers; and
        a second periphery structure comprising a plurality of second peripheral circuits electrically connected to the second memory stack; and
    an inter-assembly bonding layer between the first semiconductor assembly and the second semiconductor assembly,
    wherein:
    bonding contacts in the inter-assembly bonding layer are arranged only in a peripheral region that is outside a memory core region where the first memory stack and the second memory stack are formed and outside a staircase region where the first memory stack and the second memory stack terminate;
    the first array structure further comprises a first doped semiconductor layer, a channel structure extending vertically through the first memory stack, and a first insulating structure extending vertically through the first memory stack without extending into the first doped semiconductor layer, and the second array structure comprises a second doped semiconductor layer and a second insulating structure extending vertically through the second memory stack without extending into the second doped semiconductor layer;
    the first doped semiconductor layer extends laterally from the memory core region to the peripheral region, and the channel structure further extends through the first doped semiconductor layer and comprises a source contact in contact with the first doped semiconductor layer;
    the channel structure further comprises a channel plug that is connected with the first periphery structure through interface contacts between the first array structure and the first peripheral structure; and
    the first insulating structure and the second insulating structure are symmetric about the inter-assembly bonding layer, and the first doped semiconductor layer and the second doped semiconductor layer are interposed between the first insulating structure and the second insulating structure.

2. The 3D memory device of claim 1, wherein the inter-assembly bonding layer comprises a conductive material and a dielectric material,
    wherein the inter-assembly bonding layer comprises a first portion adjacent to the first semiconductor assembly and a second portion adjacent to the second semiconductor assembly,
    wherein the first portion comprises a first bonding contact embedded within a first bonding layer of the first portion, and
    wherein the second portion comprises a second bonding contact embedded within a second bonding layer of the second portion.

3. The 3D memory device of claim 2, wherein the first bonding contact and the second bonding contact jointly serve as an electrical connection between the first semiconductor assembly and the second semiconductor assembly.

4. The 3D memory device of claim 3, wherein at least one of the plurality of first peripheral circuits is electrically connected to at least one of the plurality of second peripheral circuits via the first and second bonding contacts of the inter-assembly bonding layer.

5. The 3D memory device of claim 2, wherein the first and second bonding contacts are provided in the inter-assembly bonding layer of the peripheral region that is at a location laterally away from both the first memory stack and the second memory stack.

6. The 3D memory device of claim 1, wherein the first array structure is vertically more adjacent to the inter-assembly bonding layer than the first periphery structure, and
    wherein the second array structure is vertically more adjacent to the inter-assembly bonding layer than the second periphery structure.

7. The 3D memory device of claim 1, wherein:
    the channel structure of the first array structure is a first channel structure,
    the second array structure comprises a second channel structure extending vertically through the second memory stack, and
    the second channel structure is in contact with the second doped semiconductor layer disposed above the second memory stack.

8. The 3D memory device of claim 1, wherein the first doped semiconductor layer includes doped polysilicon.

9. The 3D memory device of claim 1, wherein:
    the channel structure of the first array structure is a first channel structure, the second array structure comprises a second channel structure extending vertically through the second memory stack and extending vertically through a semiconductor layer, and a semiconductor channel along a sidewall of the second channel structure is in contact with a sublayer of the semiconductor layer.

10. The 3D memory device of claim 1, wherein:

the channel structure of the first array structure is a first channel structure, and the channel plug is a first channel plug, the second array structure comprises a second channel structure having a semiconductor channel and a second semiconductor plug, and the second semiconductor plug is in contact with the semiconductor channel.

11. The 3D memory device of claim 1, wherein:

the channel structure of the first array structure is a first channel structure, the second array structure comprises a second channel structure; and the first channel structure of the first array structure and the second channel structure of the second array structure are symmetric about the inter-assembly bonding layer.

12. The 3D memory device of claim 1, wherein a substrate is provided on a side of one of the first semiconductor assembly and the second semiconductor assembly, and wherein the substrate faces away from the inter-assembly bonding layer.

13. The 3D memory device of claim 12, wherein a pad-out contact layer is provided on a side of another one of the first semiconductor assembly and the second semiconductor assembly, and wherein the pad-out contact layer faces away from the inter-assembly bonding layer.

14. A method for forming a three-dimensional (3D) memory device, comprising:

providing a first semiconductor assembly by:
 providing a first semiconductor substrate;
 forming a first array structure on the first semiconductor substrate, wherein the first array structure comprises a first memory stack having a plurality of interleaved stack conductive layers and stack dielectric layers; and
 forming a first periphery structure adjacent to the first array structure, wherein the first periphery structure comprises a plurality of first peripheral circuits electrically connected to the first memory stack;

providing a second semiconductor assembly by:
 providing a second semiconductor substrate;
 forming a second array structure on the second semiconductor substrate, wherein the second array structure comprises a second memory stack having a plurality of interleaved stack conductive layers and stack dielectric layers; and
 forming a second periphery structure adjacent to the second array structure, wherein the second periphery structure comprises a plurality of second peripheral circuits electrically connected to the second memory stack; and bonding the first semiconductor assembly and the second semiconductor assembly through an inter-assembly bonding layer, wherein:

bonding contacts in the inter-assembly bonding layer are arranged only in a peripheral region that is outside a memory core region where the first memory stack and the second memory stack are formed and outside a staircase region where the first memory stack and the second memory stack terminate, the first array structure further comprises a first doped semiconductor layer, a channel structure extending vertically through the first memory stack, and a first insulating structure extending vertically through the first memory stack without extending into the first doped semiconductor layer, and the second array structure comprises a second doped semiconductor layer and a second insulating structure extending vertically through the second memory stack without extending into the second doped semiconductor layer, the first doped semiconductor layer extends laterally from the memory core region to the peripheral region, and the channel structure further extends through the first doped semiconductor layer and comprises a source contact in contact with the first doped semiconductor layer, the channel structure further comprises a channel plug that is connected with the first periphery structure through interface contacts between the first array structure and the first peripheral structure; and the first insulating structure and the second insulating structure are symmetric about the inter-assembly bonding layer, and the first doped semiconductor layer and the second doped semiconductor layer are interposed between the first insulating structure and the second insulating structure.

15. The method of claim 14, wherein the first array structure and the first periphery structure are bonded through a first bonding interface, and wherein the second array structure and the second periphery structure are bonded through a second bonding interface.

16. The method of claim 15, wherein providing the first semiconductor assembly further comprises removing a portion of the first semiconductor substrate from a side of the first array structure to expose one or more peripheral contacts in the first array structure, and wherein providing the second semiconductor assembly further comprises removing a portion of the second semiconductor substrate from a side of the second array structure to expose one or more peripheral contacts in the second array structure.

17. The method of claim 16, wherein bonding the first semiconductor assembly and the second semiconductor assembly further comprises forming a first portion of the inter-assembly bonding layer adjacent to the first semiconductor assembly, wherein the first portion comprises a first bonding contact embedded within a first bonding layer, wherein bonding the first semiconductor assembly and the second semiconductor assembly further comprises forming a second portion of the inter-assembly bonding layer adjacent to the second semiconductor assembly, and wherein the second portion comprises a second bonding contact embedded within a second bonding layer.

18. The method of claim 17, wherein bonding the first semiconductor assembly and the second semiconductor assembly further comprises:

bonding the first portion and the second portion of the inter-assembly bonding layer.

19. A system, comprising:
a three-dimensional (3D) memory device configured to store data, the 3D memory device comprising:
- a first semiconductor assembly comprising:
  - a first array structure comprising a first memory stack having a plurality of interleaved stack conductive layers and stack dielectric layers; and
  - a first periphery structure comprising a plurality of first peripheral circuits electrically connected to the first memory stack;
- a second semiconductor assembly comprising:
  - a second array structure comprising a second memory stack having a plurality of interleaved stack conductive layers and stack dielectric layers; and
  - a second periphery structure comprising a plurality of second peripheral circuits electrically connected to the second memory stack; and
- an inter-assembly bonding layer between the first semiconductor assembly and the second semiconductor assembly, wherein:
bonding contacts in the inter-assembly bonding layer are arranged only in a peripheral region that is outside a memory core region where the first memory stack and the second memory stack are formed and outside a staircase region where the first memory stack and the second memory stack terminate,
the first array structure further comprises a first doped semiconductor layer, a channel structure extending vertically through the first memory stack, and a first insulating structure extending vertically through the first memory stack without extending into the first doped semiconductor layer, and the second array structure comprises a second doped semiconductor layer and a second insulating structure extending vertically through the second memory stack without extending into the second doped semiconductor layer,
the first doped semiconductor layer extends laterally from the memory core region to the peripheral region, and the channel structure further extends through the first doped semiconductor layer and comprises a source contact in contact with the first doped semiconductor layer,
the channel structure further comprises a channel plug that is connected with the first periphery structure through interface contacts between the first array structure and the first peripheral structure; and
the first insulating structure and the second insulating structure are symmetric about the inter-assembly bonding layer, and the first doped semiconductor layer and the second doped semiconductor layer are interposed between the first insulating structure and the second insulating structure; and
a memory controller coupled to the 3D memory device and configured to control the 3D memory device.

20. The system of claim 19, further comprising a host coupled to the memory controller and configured to send or receive the data.

* * * * *